United States Patent
Miyajima

(10) Patent No.: US 6,350,113 B1
(45) Date of Patent: Feb. 26, 2002

(54) RESIN MOLDING MACHINE

(75) Inventor: Fumio Miyajima, Togura-machi (JP)

(73) Assignee: Apic Yamada Corporation, Nagano (JP)

(*) Notice: Subject to any disclaimer, the term of this patent is extended or adjusted under 35 U.S.C. 154(b) by 0 days.

(21) Appl. No.: 09/513,828

(22) Filed: Feb. 25, 2000

Related U.S. Application Data

(62) Division of application No. 09/112,018, filed on Jul. 8, 1998, now Pat. No. 6,187,243.

(30) Foreign Application Priority Data

Jul. 11, 1997 (JP) .............................................. 9-186529
Apr. 30, 1998 (JP) ........................................... 10-120793

(51) Int. Cl.$^7$ .......................... H01L 21/56; B29C 45/14
(52) U.S. Cl. ..................... 425/89; 264/272.17; 264/316; 264/272.15; 425/116; 425/125; 425/544
(58) Field of Search ....................... 264/272.15, 272.17, 264/276, 328.9, 316; 425/116, 125, 89, 544, 572, 588

(56) References Cited

U.S. PATENT DOCUMENTS

| | | | |
|---|---|---|---|
| 5,344,795 A | 9/1994 | Hashemi et al. | 264/272.17 |
| H1654 H | * 6/1997 | Rounds | 264/316 |
| 5,766,535 A | 6/1998 | Ong | 264/272.15 |
| 5,766,650 A | 6/1998 | Peters et al. | 425/116 |
| 5,766,987 A | * 6/1998 | Mitchell et al. | 438/126 |
| 5,891,483 A | * 4/1999 | Miyajima | 425/89 |
| 5,997,798 A | 12/1999 | Tetreault et al. | 425/116 |
| 6,048,483 A | 4/2000 | Miyajima | 425/544 |

FOREIGN PATENT DOCUMENTS

| | | |
|---|---|---|
| EP | 665584 A1 | 8/1995 |
| EP | 747942 A2 | 11/1996 |
| JP | A 8-142105 | 6/1996 |
| JP | A 8-142109 | 6/1996 |
| JP | A 9-57785 | 3/1997 |
| JP | 9-76281 A * | 3/1997 |
| JP | 9-117935 A * | 5/1997 |

* cited by examiner

Primary Examiner—Robert Davis

(57) ABSTRACT

A resin molding machine is capable of preventing molded products from forming resin flash on their surfaces. The resin molding machine includes a press section, a loading section, an unloading section, an accommodating section, a film feeding section, and an air sucking mechanism. By pressing the release film on the surface of the part of the work piece, the release film prevents the melted resin from invading into a gap between the release film and the work piece, so that no resin flash is formed on the surface of the work piece.

9 Claims, 19 Drawing Sheets

FIG.13
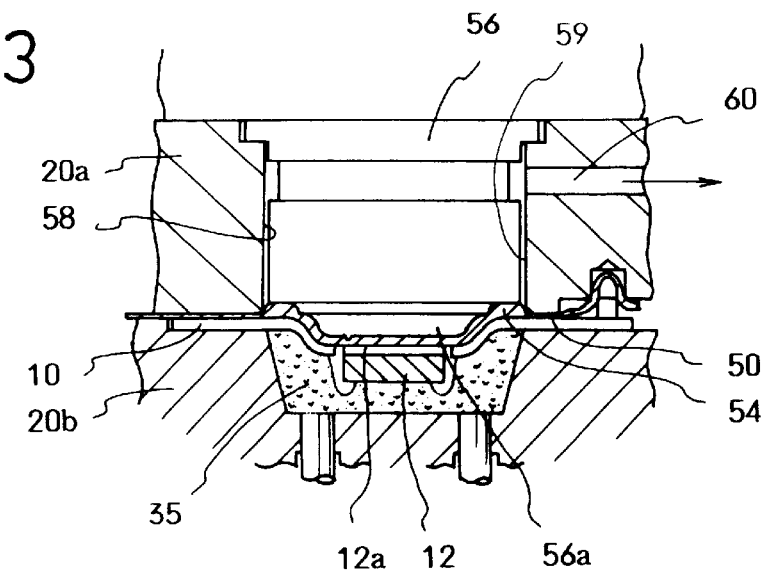
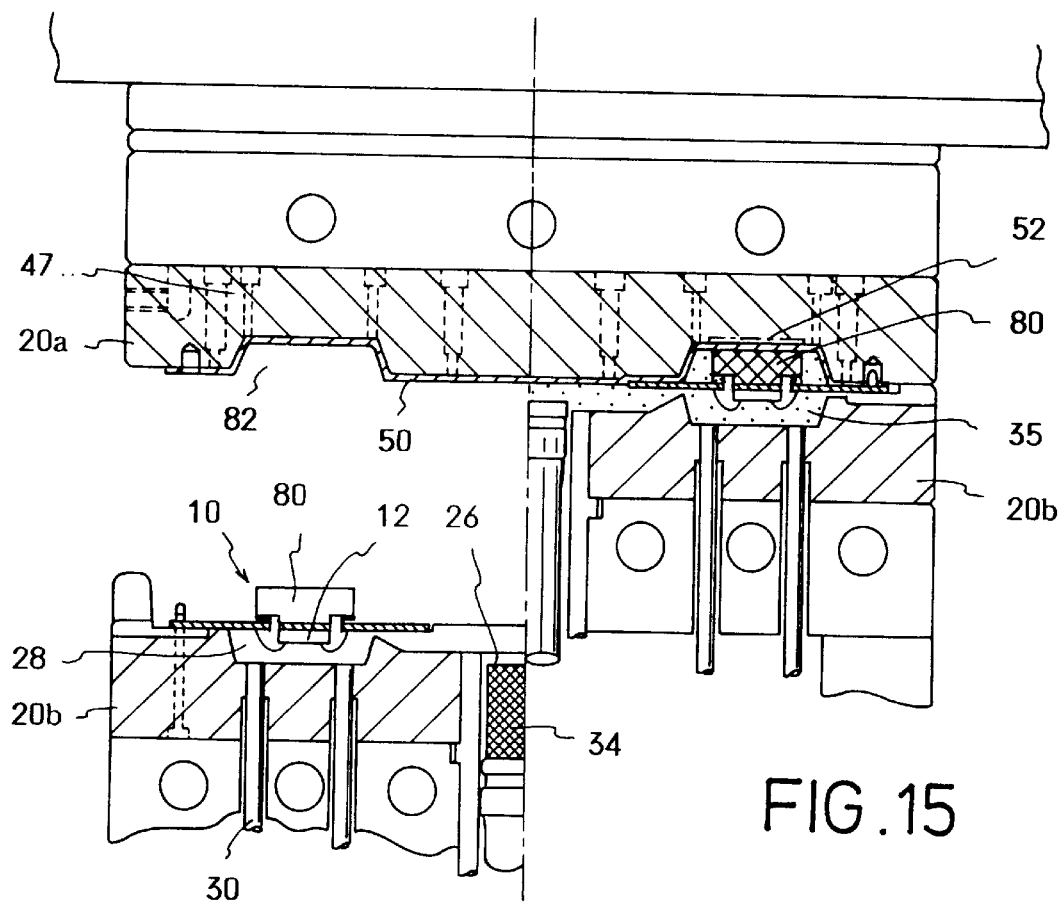
FIG.15

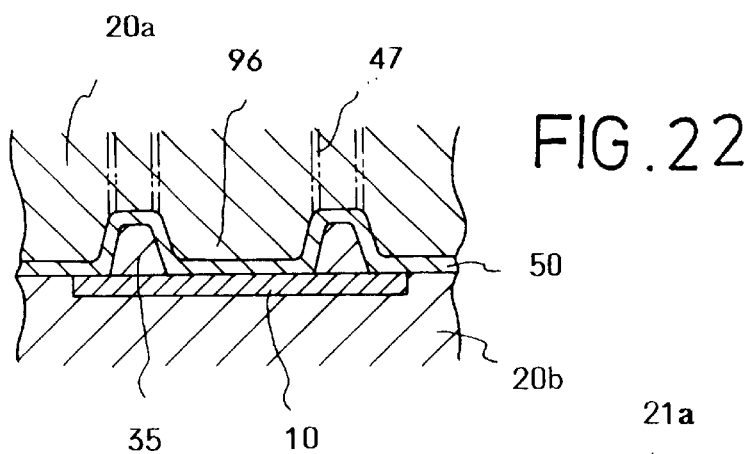
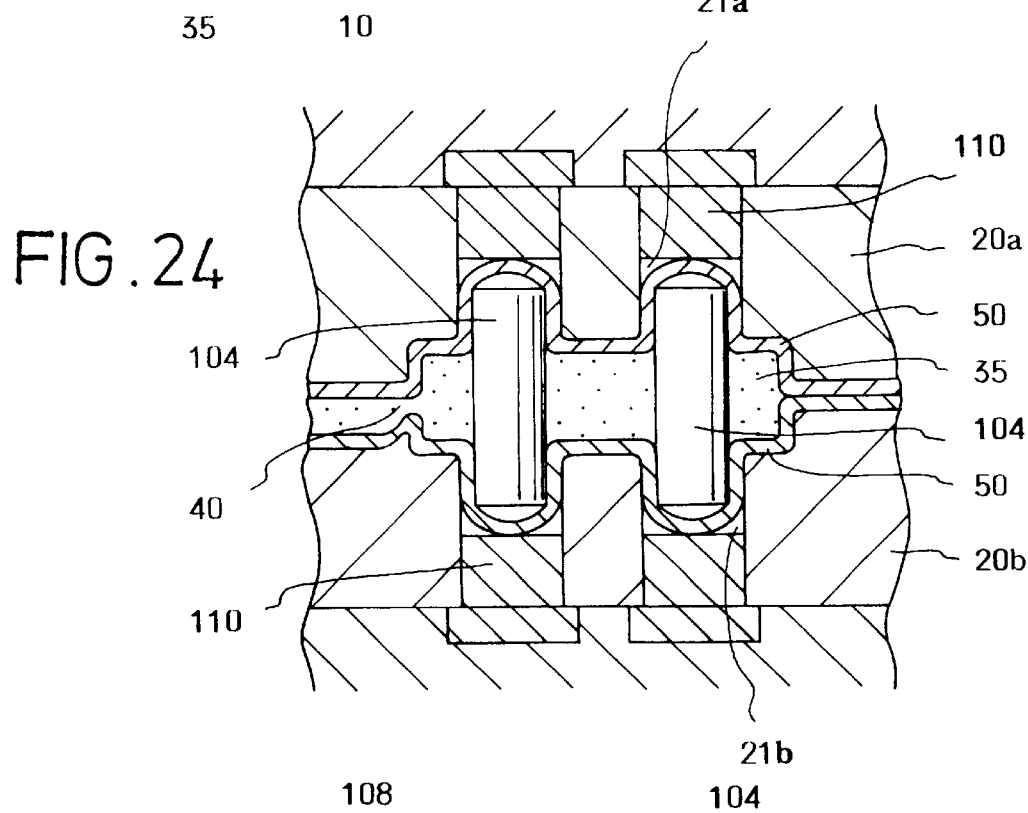
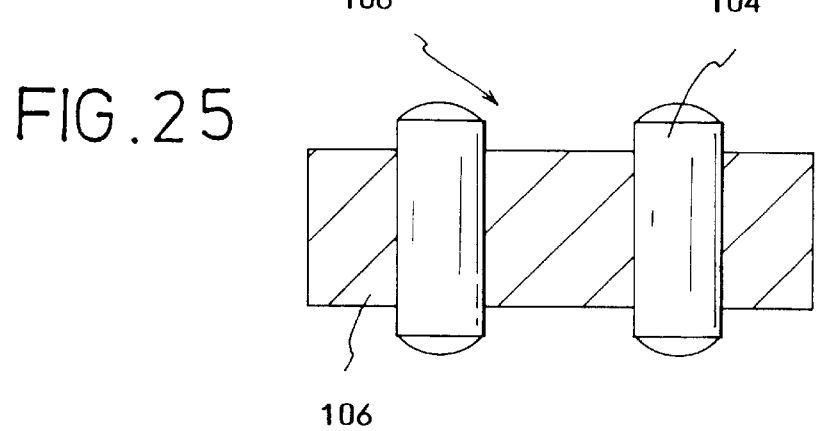

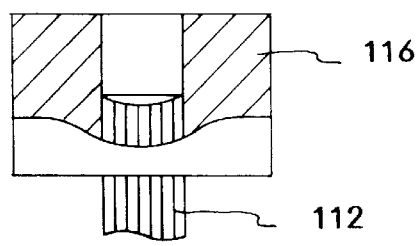
FIG.26
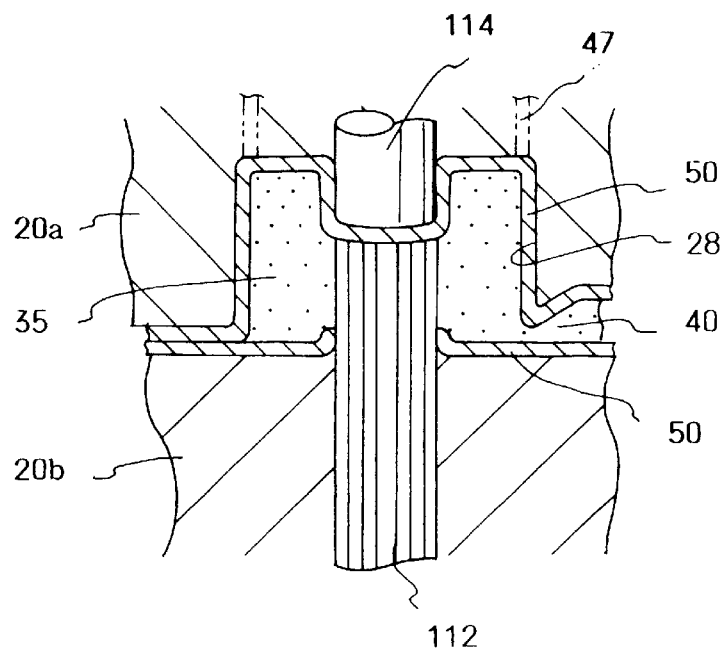
FIG.27
FIG.28
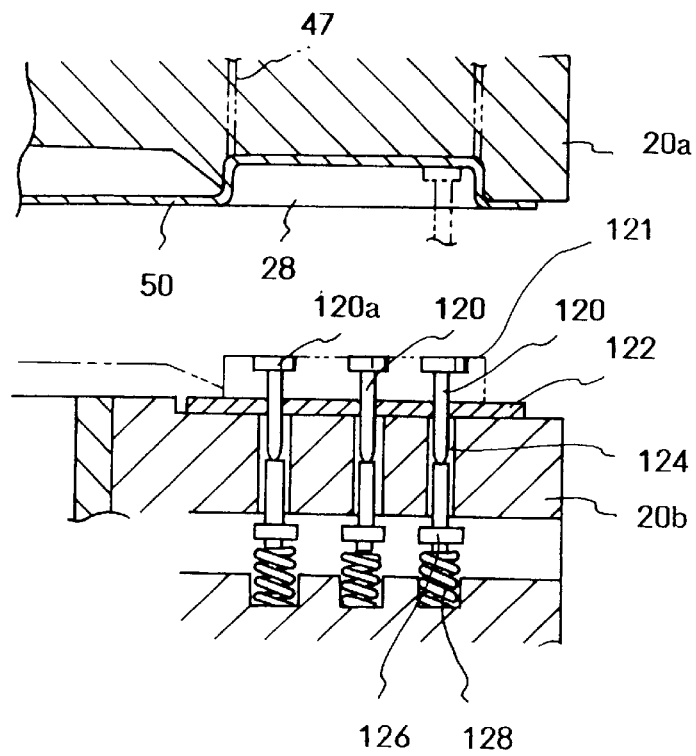

RESIN MOLDING MACHINE

This application is a divisional of application Ser. No. 09/112,018, filed on Jul. 8, 1998, and now U.S. Pat. No. 6,187,243 the entire contents of which are hereby incorporated by reference.

BACKGROUND OF THE INVENTION

1. Field of the Invention

The present invention relates to a method of resin molding and a resin molding machine for the method.

2. Description of Related Art

The applicant of the present invention has invented molding machines, in which parting faces of molding dies are covered with release film while molding (see Japanese Patent Kokai Gazettes No. 8-142105, No. 8-142109 and No. 9-57785). In the conventional resin molding machines, the parting faces, which include cavities, of the molding dies are covered with the release film, then resin molding is executed in the cavities. By using the release film, resin can be solidified without sticking to the molding dies. Further, molded products can be easily ejected from the molding dies, so no ejector pins are required and structures of the molding dies can be simpler. Many types of resin, e.g., tablet, pellet, liquid, can be employed in the conventional molding machines.

FIG. 31 is a front view of a conventional resin molding machine, in which no release film is used; FIG. 32 is a plan view thereof. In the resin molding machine, a part "A" is a press section for clamping and molding work pieces, e.g., lead frames, with resin; a part "B" is a work feeding section, in which the work pieces are fed; a part "C" is a tablet feeding section, in which resin tablets are fed; a part "D" is a loading section, in which the work pieces and the resin tablets are arranged and set into a molding die; a part "E" is an unloading section, in which molded products are taken out from the molding dies and disused resin of the products are removed; and a part "F" is an accommodating section for accommodating the molded products.

As described above, the resin molding machine using the release film has some advantages. For example, the molded products can be easily ejected from the molding die, and the structures of the molding dies can be simpler. The structure of the resin molding machine using the release film is quite different from that of the resin molding machine using no release film. To execute the method of resin molding with the release film, the old molding machines must be fully replaced, so the equipment cost must be quite higher.

However, quality of the molded products, which are molded by the resin molding machine shown in FIGS. 31 and 32, is not fully satisfied. In the case of molding lead frames with resin, the resin molding machine has the following disadvantages: resin flash is apt to be formed on the surface of the molded product; thickness of the molded products are not fixed; and it is difficult to mold thinner products.

In FIGS. 33–35, a work piece (a lead frame of transistors) 200 having heat sinks 202 are molded with resin. The work piece is clamped by molding dies and molded by filling the resin in cavities 206 via gates 204. Dam blocks 208 fill spaces between adjacent work piece 200 so as not to leak the resin. The height of the dam blocks 208 is slightly lower than the thickness of the work piece 200 so as not to damage the opposite parting face of the molding die when the molding dies clamp the work piece 200. Thus, thin resin flash is formed between the dam blocks 208 and the opposite parting face.

The resin flash 210 is formed between the dam block 208 and the work piece 200 and on outer faces of the heat sinks 202. The resin flash 210 is also formed in the peripheral of resin paths connecting pots to the cavities 206, e.g., the gates 204, and in the peripheral of culls 212. This is because securely clamping the work piece 200 has priority over preventing the resin flash, so the resin flash 210 is apt to be formed between the molding dies.

In FIG. 36, a work piece (a plastic circuit board of BGA) 200 is molded with resin. The resin flash 210 is formed in the vicinity of molded parts 214. The thickness of the plastic circuit boards is not fixed, so all plastic circuit boards cannot be clamped with fixed clamping force. Therefore resin flash maybe formed on surfaces of the molded products.

If the molded products have resin flash formed thereon, the step of removing the resin flash is required after a molding step. Furthermore, the resin flash is scattered in all directions when the molded products are taken out from the molding die; the scattered resin causes troubles. Further, if the resin flash is formed on a surfaces of an electric terminal, the molded product cannot be electrically connected.

SUMMARY OF THE INVENTION

An object of the present invention is to provide a method of resin molding and a molding machine, which are capable of preventing molded products from forming resin flash on their surfaces.

To achieve the object, the method of the present invention comprises the steps of:

covering over a parting face, which includes a molding section, of at least one of molding dies with release film;

clamping a work piece, with the release film, by the molding dies; and filling the melted resin in the molding section of the molding die, wherein the release film is tightly pressed on a surface of a part of the work piece, which is exposed after molding, in the clamping step.

By pressing the release film on the surface of the part of the work piece, the release film prevents the melted resin from invading into a gap between the release film and the work piece, so that no resin flash is formed on the surface of the work piece.

In the method, the part of the work piece, which is exposed after molding, may be located in the molding section of the molding die when the molding dies clamp the work piece.

In the method, the part of the work piece, which is exposed after molding, may be located outside of the molding section of the molding die when the molding dies clamp the work piece.

In the method, the molding section may be formed in the parting face of one of the molding dies, wherein a parting face of the other molding die is a flat face on which the release film is fed.

In the method, an escaping section, in which the release film can be accommodated, may be formed in the parting face of the molding die, whereby deformation of the work piece is prevented when the molding die presses the release film on the surface of the work piece.

In the method, the part of the work piece, which is exposed after molding, may be an electric terminal.

In the method, the part of the work piece, which is exposed after molding, may be a heat radiating part.

In the method, the part of the work piece, which is exposed after molding, may be an optical transparent part.

Furthermore, the resin molding machine of the present invention comprises:
- a press section including a couple of molding dies for clamping and molding a work piece to be molded, and a couple of platens to which the molding dies are respectively attached;
- a loading section for setting the work piece and a resin material into the molding die of the press section;
- an unloading section for conveying a molded product from the press section;
- an accommodating section for accommodating the molded product, in which disused resin has been removed;
- a film feeding mechanism being provided to one of the platens, the film feeding mechanism feeding release film to cover over a parting face, which includes a molding section, of at least one of the molding dies; and
- an air sucking mechanism for fixing the release film on the parting face of the molding die by air suction.

The release film is fed onto the parting face of the molding die by the film feeding mechanism, and the molding section therein is covered with the release film. By the release film, the work piece can be molded without sticking the resin on the molding section.

In the resin molding machine, the loading section may be located on one side of the press section, the unloading section may be located on the other side thereof, and
- the film feeding mechanism may feed the release film in the direction perpendicular to a line connecting the loading section and the unloading section.

In the resin molding machine, the film feeding mechanism may comprise:
- a feeding roller on which long new release film has been wound, the feeding roller being provided on one side of the molding dies;
- a collecting roller for winding used release film, which has passed over the parting face of the molding die, the collecting roller being provided on the other side of the molding dies; and
- a driving section for rotating the feeding roller and the collecting roller according to molding action of the resin molding machine.

In the resin molding machine, the width of the release film may be designed to cover over the whole parting face of the molding die.

In the resin molding machine, the width of the release film may be equal to that of the work piece, and
- the release film may be fed to a position corresponding to the work piece.

The resin molding machine may further comprise lock blocks being respectively provided to the molding dies and capable of engaging with each other to correctly position the molding dies when the molding dies clamp the work piece, the lock blocks being arranged not to interfere with the release film covering the molding die.

In the resin molding machine, an escaping section, in which the release film can be accommodated, may be formed in the parting face of the molding die.

In the resin molding machine, a drawing groove, into which a slackened part of the release film is drawn by air suction, may be formed in a peripheral of the molding section of the molding die.

In the resin molding machine, a drawing groove, into which a slackened part of the release film is drawn by air suction, may be formed in a peripheral of the escaping section of the molding die.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Embodiments of the present invention will now be described by way of examples and with reference to the accompanying drawings, in which:

FIG. 13 is a sectional view of the molding dies for encapsulating a die-pad whose bottom face is exposed;

FIG. 15 is a sectional view of molding dies of a Fifth Embodiment;

FIG. 22 is a sectional views of molding dies for encapsulating one side of a circuit board with resin;

FIG. 24 is a sectional view of molding dies of an Eleventh Embodiment;

FIG. 25 is a sectional view of molded optical parts;

FIG. 26 is a sectional view of molding dies of a Twelfth Embodiment;

FIG. 27 is a sectional view of a molded product in which optical fiber cables are held by a molded part;

FIG. 28 is a sectional view of molding dies of a Thirteenth Embodiment;

DETAILED DESCRIPTION OF THE PREFERRED EMBODIMENTS

Preferred embodiments of the present invention will now be described in detail with reference to the accompanying drawings.

First Embodiment

Figure 1:
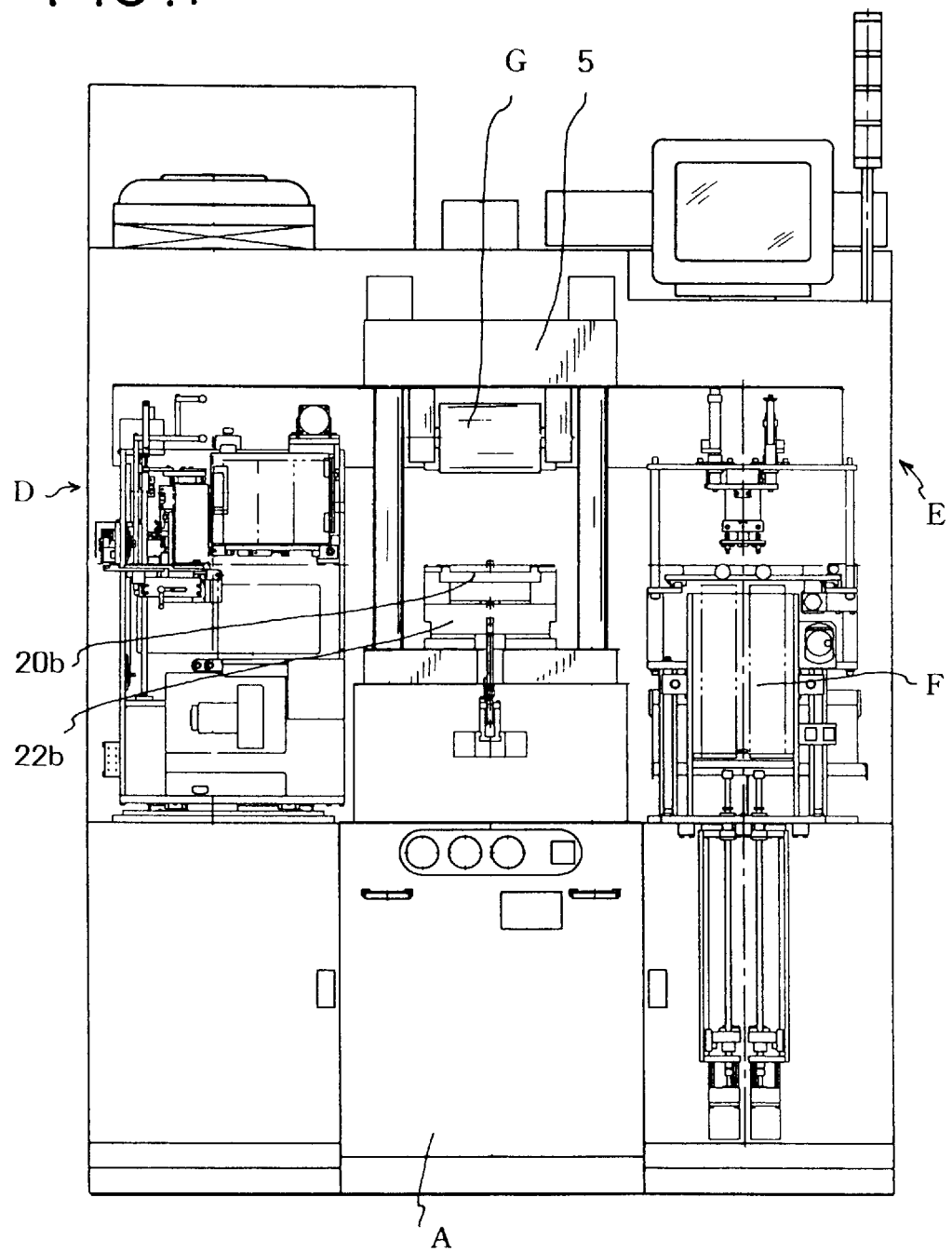
FIG. 1 is a front view of a resin molding machine of a First Embodiment of the present invention.
Figure 2:
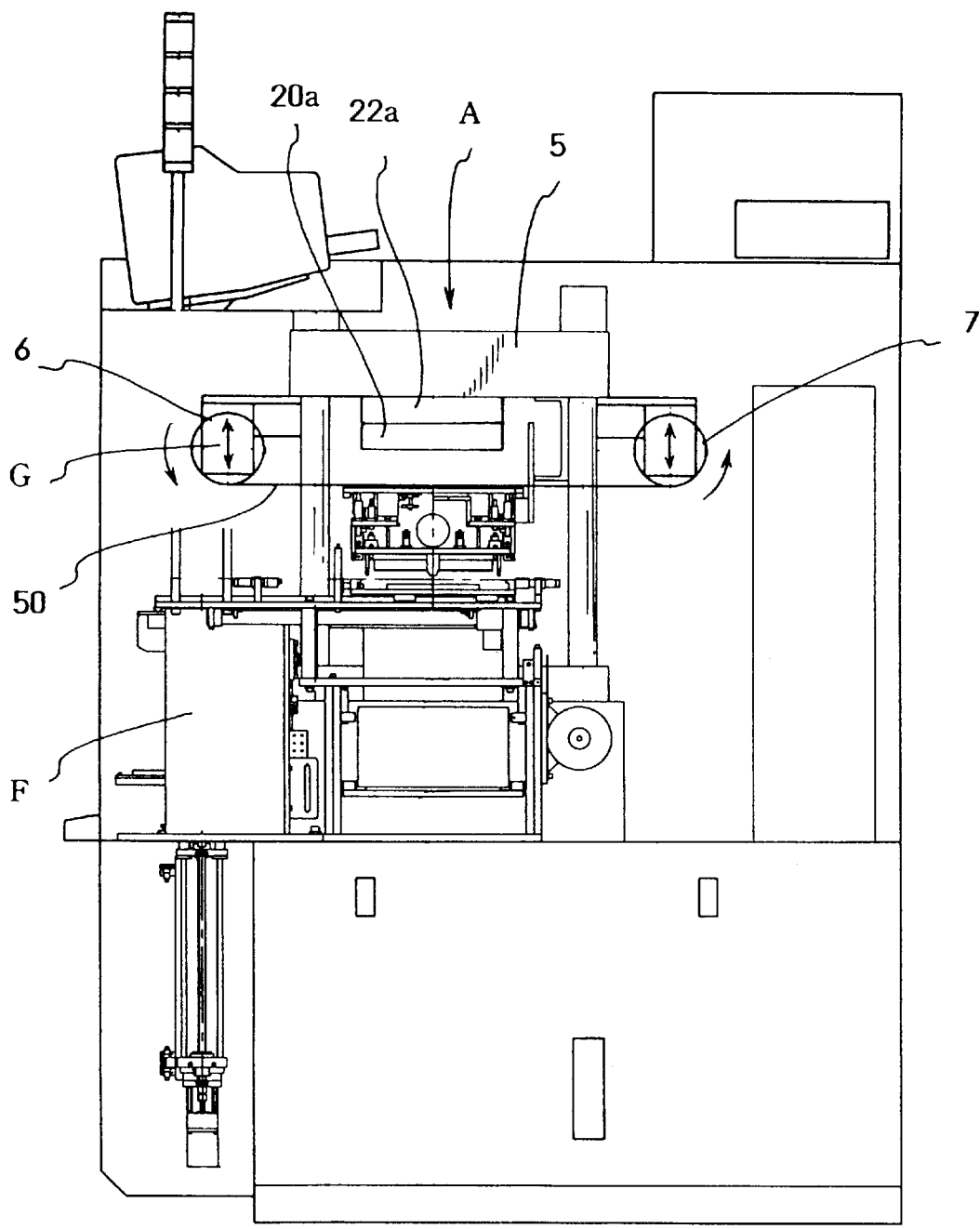
FIG. 2 is a side view thereof.
Figure 3:
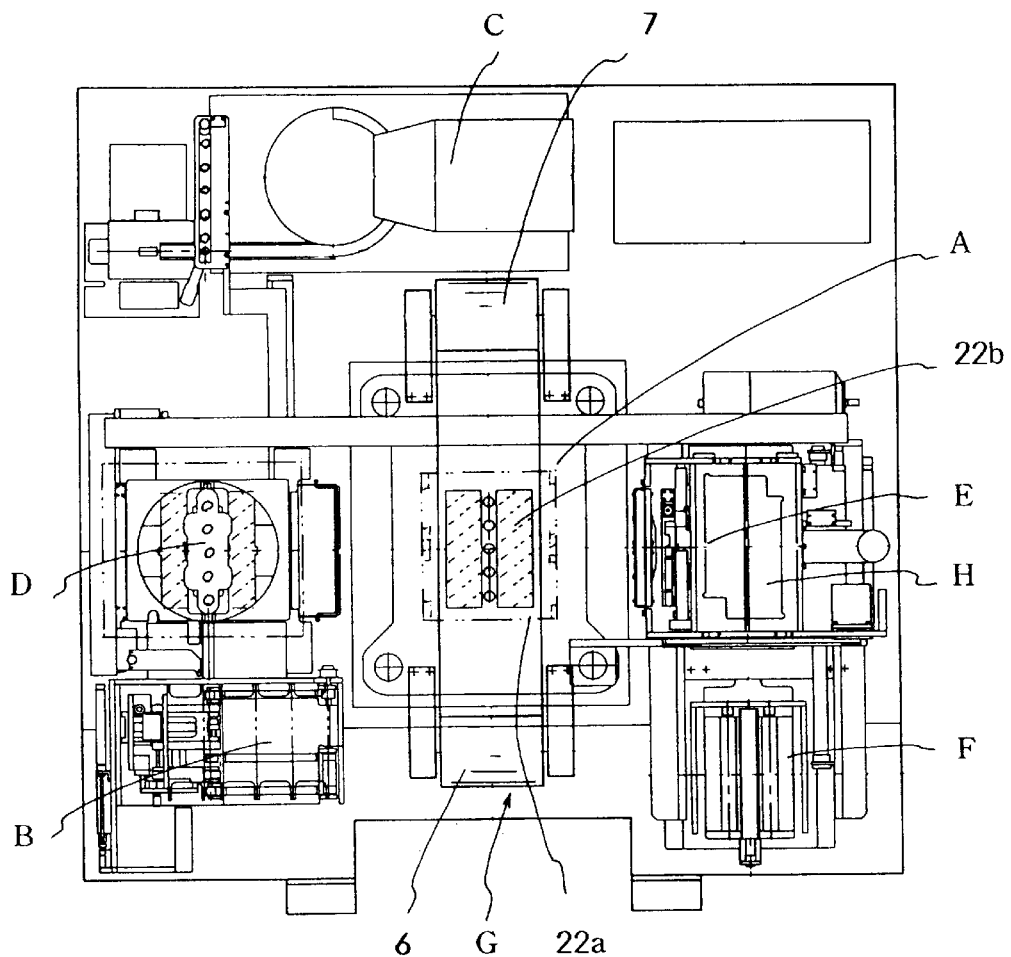
FIG. 3 is a plan view thereof.

A resin molding machine of the present embodiment is shown in FIGS. 1 and 2. A basic structure of the resin molding machine is almost the same as that of the conventional resin molding machine. Namely, the molding machine has: a press section "A"; a work feeding section "B"; a tablet feeding section "C"; a loading section "D" in which work pieces and resin tablets are arranged and set into a molding die; an unloading section "E" in which molded products are taken out from the molding dies; and an accommodating section "F" in which the molded products are accommodated.

A characterized point of the resin molding machine of the present embodiment is a film feeding mechanism "G", which is provided to an upper side of the press section "A". The press section "A" has a fixed platen 5, which holds an upper base 22a and an upper molding die 20a. The film feeding mechanism "G" is held by the fixed platen 5. The film feeding mechanism "G" feeds the release film 50 from a front side of the press section "A" to a rear side thereof.

As shown in FIG. 2, the film feeding mechanism "G" includes a feeding roller 6, around which the new release film 50 is wound, and a collecting roller 7, which collects the used release film 50. The feeding roller 6 is provided on the front side of the press section "A"; the collecting roller 7 is provided on the rear side thereof. A driving section synchronously drives the rollers 6 and 7 with molding action of the machine, so the release film 50 is intermittently fed a prescribed length. In the present embodiment, the width of the release film is designed to cover over a whole parting face of the molding die.

The release film 50 is capable of resisting temperature of the molding dies, which are heated to mold work pieces. The release film 50 is easily peeled off from the solidified resin. The release film 50 has enough flexibility so as to cover and protect the surfaces of the work pieces and to act as a cushion. Thus, FEP film, PET film, glass cloth including fluorine, film of polyvinylidene chloride, FETF film, etc. can be used as the release film 50.

A summarized method of resin molding by the resin molding machine will be explained. The resin tablets, which have been fed by the tablet feeding section "C", are accommodated in a resin holder and conveyed to a position under the loading section "D". The work pieces, e.g., lead frames, are conveyed from the work feeding section "B" to the loading section "D". In the loading section "D", the work pieces and the resin tablets are transferred to a loader.

The work pieces and the resin tablets are conveyed to the press section "A" by the loader. Furthermore, the resin tablets are respectively set in pots of the molding die; the work pieces are set on the molding die. The work pieces are clamped, by the molding dies of the press section "A", together with the release film 50. The melted resin is sent from the pots to molding sections (cavities) to mold or encapsulate the work pieces.

After molding, the molding dies are opened, and molded products, which have been molded in the press section "A", are conveyed to a degating section "H". At the degating section "H", disused resin, which is stuck to the molded product, is removed, and the molded products are accommodated in the accommodating section "F".

In the case of feeding the release film 50 to the upper molding die 20a, the parting face of the upper die 20a need not be cleaned, so a cleaner of the unloading section "E" is capable of cleaning a parting face of the lower molding die 20b only.

The release film 50, which is covering over the molding die, is renewed for each molding cycle or a prescribed number of molding cycles. When the new release film 50 is fed to the molding die, the release film 50 is slightly separated away from the parting face of the molding die by a moving mechanism, which is capable of vertically moving the release film 50.

Figure 4:
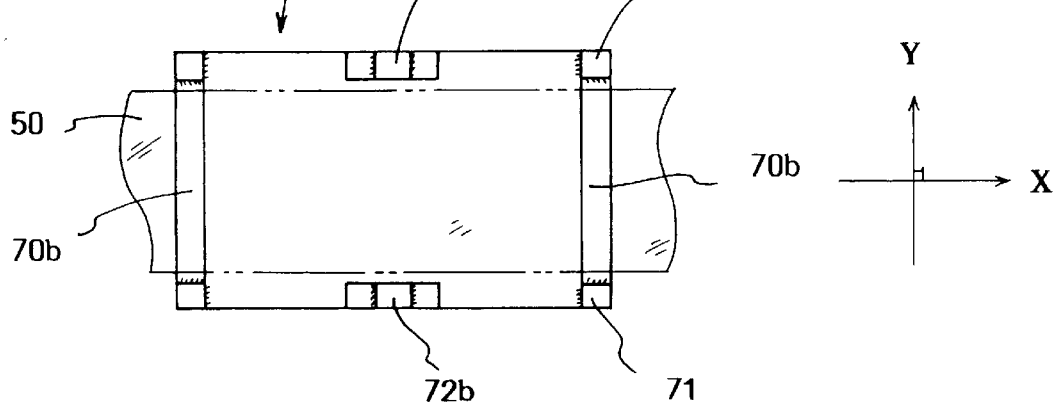
FIG. 4 is an explanation view showing lock blocks of a molding die of the molding machine.
Figure 5:
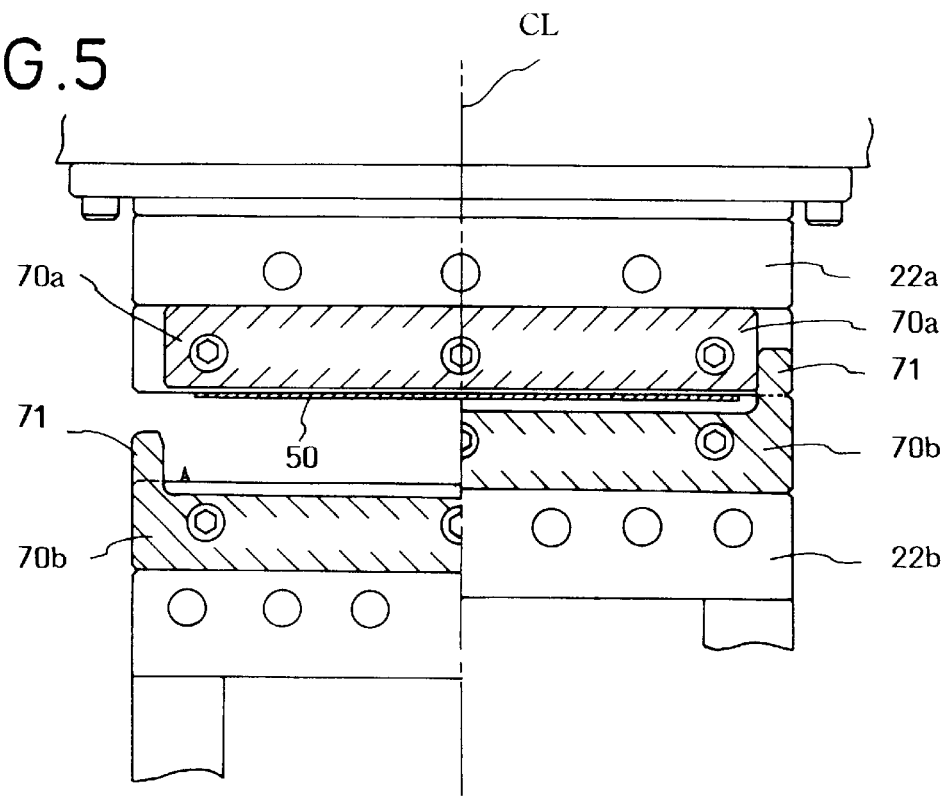
FIG. 5 is an explanation view of an engaging state and a disengaging state of the lock blocks of the molding dies.

FIGS. 4 and 5 show lock blocks 70a, 70b, 72a and 72b of the molding dies 20a and 20b, which allow the release film 50 to move from the front side of the molding dies to the rear side thereof. When the work pieces are clamped by the molding dies 20a and 20b, the lock blocks 70a and 72a and the lock blocks 70b and 72b are mutually engaged so as to correctly position the molding dies 20a and 20b. Arrangement of the lock blocks 70b and 72b of the lower die 20b is shown in FIG. 4. FIG. 5 is a sectional view of the molding dies 20a and 20b, in which the release film 50 is sent in the direction perpendicular to the surface of the drawing sheet, and in which an engaging state of the lock blocks 70a and 70b of the molding dies 20a and 20b is shown on the right side of a center line CL.

To correctly position the molding dies 20a and 20b, the positions of the centers of the molding dies, in the X- and the Y-directions, are mutually coincided by engaging the lock blocks 70a and 72a of the upper die 20a with the lock blocks 70b and 72b of the lower die 20b. In the present embodiment, the lock blocks 70a, 70b, 72a and 72b must be arranged so as not to interfere with the release film 50, which has been fed on the parting faces of the molding dies. Thus, the lock blocks 70b are respectively located at both ends, in the X-direction, of the tower die 20b, and their shape allows the release film 50 to move in the X-direction (see FIG. 5).

As shown in FIG. 5, engaging projections 71 are respectively provided to each end of the lock blocks 70b. The projections 71 are located outside of an area in which the release film 50 passes, so that the molding dies 20a and 20b can be closed without interfering with the release film 50. Note that, the lock blocks 72b arranged in the Y-direction may be located at centers of edges, in the X-direction, of the lower die 20b.

Successively, the method of resin molding will be described in detail with reference to FIGS. 6 and 7.

The work pieces 10 are circuit boards of BGAs. Semiconductor chips 12 are respectively mounted on bottom faces of the work pieces 10. The semiconductor chips 12 will be molded or encapsulated with the resin; upper faces of the work pieces, on which lands have been formed as electric terminals, will be exposed. There are formed cavities 28 for resin molding in the lower die 20b. The release film 50 is fed to the upper die 20a. Note that, plastic circuit boards, tape-formed substrates, etc. can be molded as the work pieces 10.

Figure 6:
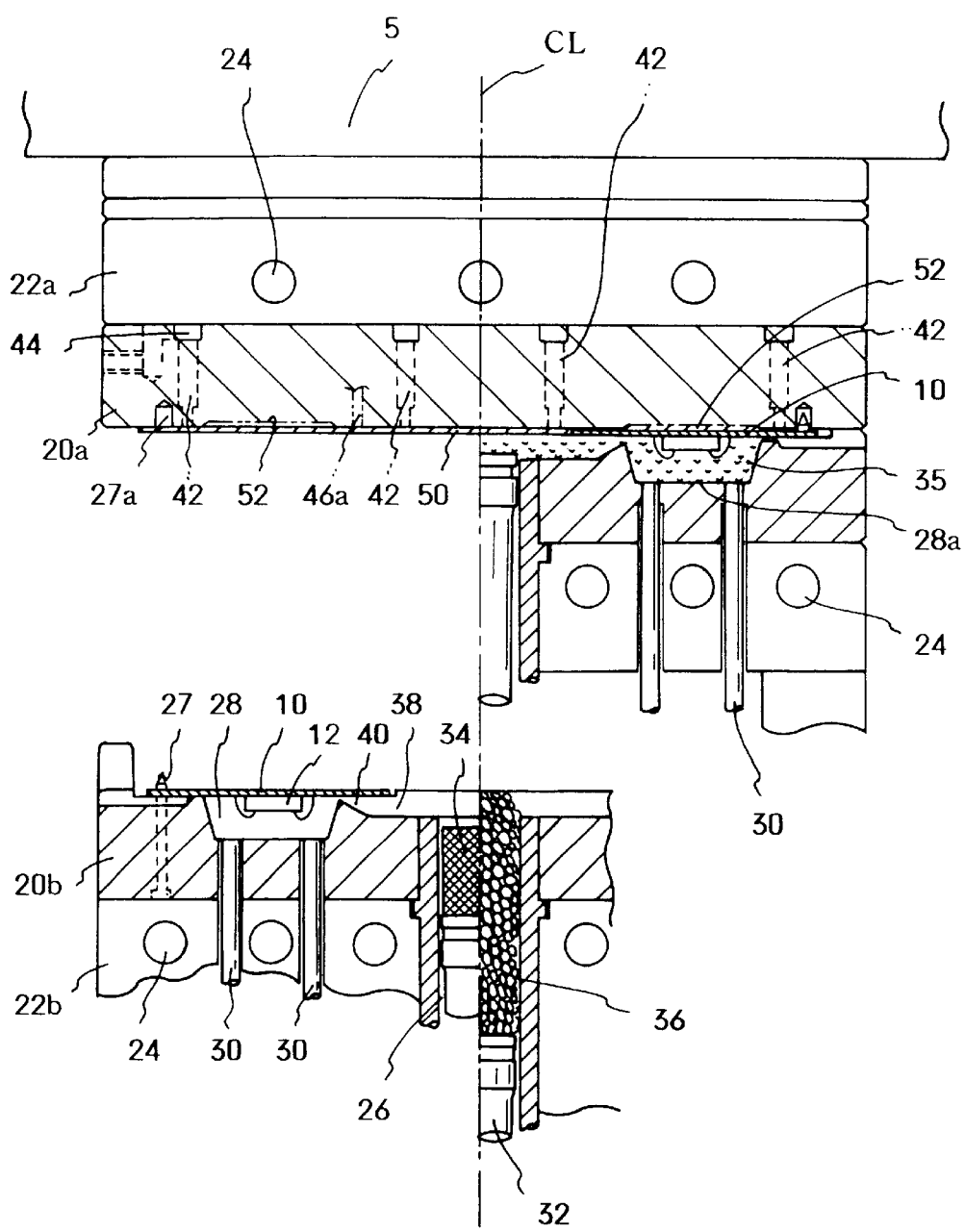
FIG. 6 is a sectional view of the molding dies.

In FIG. 6, a state of opening the molding dies 20a and 20b is shown on the left side of the center line CL; a state of closing the molding dies 20a and 20b and filling the resin in the cavities 28 is shown on the right side of the center line CL. The upper die 20a is held by the upper base 22a; the lower die 20b is held by a lower base 22b. Heaters 24 are provided in the dies 20a and 20b so as to heat the dies. The lower base 22b is held by a movable platen, which is capable of vertically moving, so that the lower die 20b is capable of vertically moving so as to open and close the dies 20a and 20b.

Two work pieces 10, each of which is formed into a rectangle, are respectively set on each side of a line of the pots 26. The work pieces 10 are correctly positioned by guide pins 27. The cavities 28 of the lower die 20b are located to correspond to the semiconductor chips 12 of the work pieces 10. Ejector pins 30 are provided in the lower die 20b and located to correspond to the cavities 28. Upper end faces of the ejector pins 30 coincide with inner bottom faces of the cavities 28. When the molded products are taken out from the cavities 28, the ejector pins 30 upwardly eject the molded products therefrom.

A plunger 32 is vertically slidably provided in each pot 26. In FIG. 6, the resin tablet 34 is set in the pot 26 (an example shown on the left side of the center line CL); the resin pellets 36 are supplied in the pot 26 (an example shown on the right side of the center line CL). The pots 26 are connected to the cavities 28 by resin paths, each of which includes runners 38 and gates 40.

The work pieces 10 are molded in the lower die 20b only, so the parting face of the upper die 20a is a flat face with no cavities. As described above, the width of the release film 50 is designed to cover over the whole parting face of the upper die 20a. The release film 50 is fixed, by air suction, on the parting face.

As shown in FIG. 6, air is sucked through air sucking holes 42 so as to fix the release film 50 on the parting face of the upper die 20a. The air sucking holes 42 are connected to air paths 44 in the upper die 20a. The air paths 44 are connected to an air sucking mechanism (not shown). The air sucking mechanism is located outside of the resin molding machine. Note that, the air sucking machine may be provided in the resin molding machine.

Figure 7:
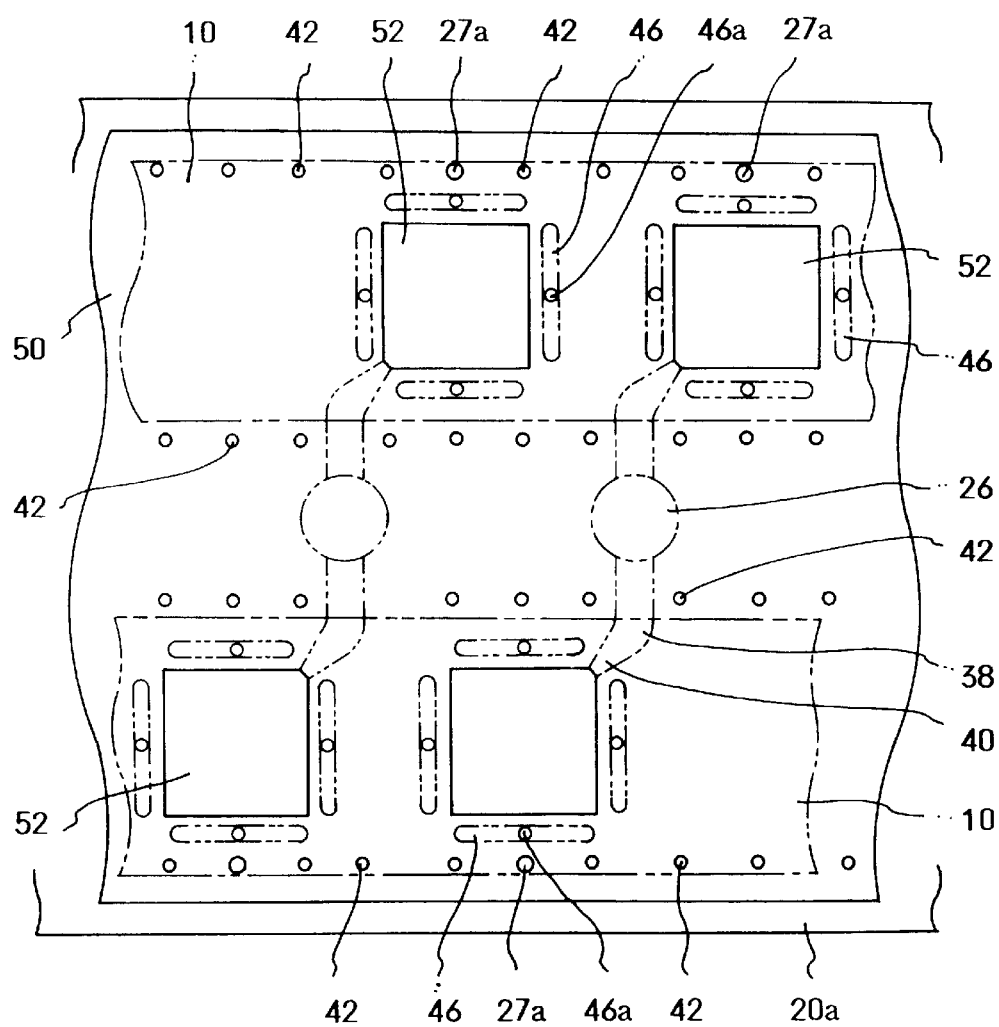
FIG. 7 is a plan view of the molding die on which release film is fed.

In FIG. 7, the release film 50 is fed on the parting face of the upper die 20a. The release film 50 covers over the whole parting face. Lines of the air sucking holes 42 are arranged in the longitudinal direction of the upper die 20a. The work pieces 10 are arranged in the same direction. Note that, symbols 27a indicate guide holes, into which the guide pins 27 will be inserted to correctly set the work pieces 10.

In the case of having other air sucking means, e.g., sucking holes in the cavities 28, drawing grooves into which a slackened part of the release film 50 is drawn by air suction, each group of the air sucking means are respectively connected to an independent air sucking mechanism. To immediately resume air suction for fixing the release film 50, a mechanism capable of extinguishing negative pressure is preferably provided.

As described above, the parting face of the upper die 20a is basically flat, but there are formed escaping sections (escaping cavities) 52, which are capable of absorbing the thickness of the release film 50, in the parting face thereof. The escaping sections 52 are located to face the cavities 28 of the lower die 20b. The depth of the escaping section 52 is slightly shallower than the thickness of the release film 50.

While clamping the work pieces 10, a force is applied to clamping regions in the parting faces of the dies 20a and 20b, which enclose edges of each cavity 28 while closing the dies 20a and 20b and which have a prescribed width. By concentrating the clamping force to the clamping regions enclosing the cavities 28 while molding, no resin leaks from the cavities 28. Since the work pieces 10 are not held in the cavities 28, the work pieces 10 are apt to be excessively pushed and deformed while clamping the work pieces 10 due to the thickness of the release film 50. But, in the present embodiment, parts of the release film 50 corresponding to the cavities 28 are accommodated in the escaping sections 52, so that deformation of the work pieces 10 can be prevented. Since the release film 50 has enough softness, the depth of the escaping section 52 may be slightly shallower than the thickness of the release film 50.

The molding action of the molding machine will be explained.

Firstly, the work pieces 10 are correctly set in the lower die 20b by the guide pins 27. In the present embodiment, a couple of work pieces 10 are set in the lower die 20b. While the molding dies 20a and 20b are opened, the release film 50 is fixed on the parting face of the upper die 20a by air suction. The new release film 50 is drawn a prescribed length from the feeding roller 6 and fixed on the parting face of the upper die 20a by sucking the air from the air sucking holes 42.

The resin for molding is supplied into the pots 26. In FIG. 6, the case of setting the resin tablet 34 in the pot 26 is shown on the left side of the center line CL. On the left side of the center line CL, the dies 20a and 20b are opened, the work piece 10 and the resin tablet 34 are set in the lower die 20b, and the release film 50 is fixed on the parting face of the upper die 20a.

Next, the work pieces 10 are clamped by the dies 20a and 20b. In the present embodiment, the lower die 20b is a movable die, so the lower die 20b is moved upward to clamp the work pieces 10. The release film 50 is sandwiched between the work pieces 10 and the upper die 20a. The cavities 28 are formed in the lower die 20b.

After clamping the work pieces 10, the resin, which has been melted in the pots 26, is exerted in the pot 26 by moving the plungers 32 upward. In FIG. 6, on the right side of the center line CL, the resin 35 is fully filled in the cavity 28a. The resin 35 is introduced into the cavity 28a via the runner 38 and the gate 40. The upper face of the work pieces 10 facing the upper die 20a is perfectly covered with the release film 50, so the lower faces of the work pieces 10, on which the semiconductor chips 12 have been respectively mounted, are encapsulated with the resin.

After solidifying the resin 35 in the cavity 28a, the dies 20a and 20b are opened, and the molded products therein are ejected by the ejector pins 30. Simultaneously, the plungers 32 are slightly moved upward to eject disused resin from the pots 26. Then, the molded products are taken out from the lower die 20a. Note that, the molded products can be easily peeled off from the release film 50, so the molded products are left in the lower die 20b when the dies 20a and 20b are opened.

After completing one cycle of the molding action, the work pieces 10 and the resin for the next molding cycle are set in the lower die 20b to mold the new work pieces 10. As described above, covering the upper face of the work pieces 10 with the release film 50 and molding the lower face thereof can be automatically executed by the resin molding machine of the present embodiment.

By covering over the upper faces of the work pieces 10 with the release film 50, no resin invades onto the upper faces thereof while molding or encapsulating the lower side of the work pieces 10. The BGA circuit boards (the work pieces 10) have exposed lands (terminals) on the upper faces, so it is very important for providing reliable BGAs to mold or encapsulte the lower side without forming thin resin flash on the lands.

By clamping the work pieces 10 with the release film 50, the clamping force can be securely applied to the edges of the cavities, so that forming resin flash can be effectively prevented. Further, deformation of the work pieces 10 can be prevented by the escaping sections 52 of the upper die 20a, so that accuracy of the molded products can be improved.

Many types of resin can be used in the resin molding machine. Namely, generally known resin, e.g., resin tablets formed into prescribed shapes, resin pellets, and resin wrapped with plastic film, can be used.

Note that, to securely clamp the work pieces 10 by the molding dies 20a and 20b, a depth of setting sections of the lower die 20b, in which the work pieces 10 are set, is slightly shallower than the thickness of the work pieces 10. In the case of multi layered BGA boards, etc., the thickness of the work pieces are not fixed. Therefore, gaps are apt to be formed between the parting faces when the work pieces are clamped; and resin flash is apt to be formed in the gaps. However, in the present embodiment, the gaps are not formed because the release film 50 close the gaps, so that no resin flash is formed. To prevent forming the resin flash, the release film 50 is required to have a sufficient thickness capable of closing said gaps and sufficient compressibility.

If the depth of the setting sections are also deeper than the thickness of the work pieces 10, forming resin flash can be prevented by clamping the work pieces 10 with the release film 50.

In the present embodiment, the characteristic points are the film feeding mechanism "G" provided to the fixed platen 5, which holds the upper die 20a, and the air sucking mechanism including the air sucking holes 42 of the upper die 20a. The film feeding mechanism "G" and the air sucking mechanism can be attached to the conventional resin molding machines to execute the above described molding method in which the release film is used.

In the present embodiment, conveying the work piece 10, conveying the molded products, feeding the release film 50, fixing the release film 50 by air suction, etc. are controlled by a control section. In the case of using no release film, the control section does not execute the film feeding action and the film fixing action, so the resin molding machine of the present embodiment can be used for the conventional molding method in which no release film is used. Namely, the resin molding machine can execute not only the method of the present invention but also the conventional methods.

In the present embodiment, slackened parts of the release film 50 are drawn into the drawing grooves 46, which are provided to enclose the escaping sections 52. When the release film 50 is fixed on the parting face of the upper die 20a, the release film 50 is expanded by the heat of the die 20a. By the expanded parts, wrinkles of the release film 50 are partially formed on the parting face of the die 20a. By the wrinkles of the release film 50, gaps are formed between the work pieces 10 and the release film 50, and the melted resin may invade into the gaps. The resin invading into the gaps forms the resin flash. Further, the clamping force concentrated to the wrinkles, so the work pieces 10 are apt to be damaged. The slackened parts of the release film 50 are drawn into the drawing grooves 46 by air suction, so that no wrinkles of the release film 50 are formed on the parting face. Air suction for removing the wrinkles are executed by air sucking holes 46a, each of which is located in the center of each drawing groove 46. Note that, if the cavities are formed in the parting face on which the release film is fixed, the drawing grooves can prevent the release film from forming the wrinkles in the cavities.

By arranging the drawing grooves 46 to enclose the escaping sections 52, no wrinkles are formed at parts corresponding to the escaping sections 52. By drawing the slackened parts of the release film 50 into the drawing grooves 46 by sucking air through the air sucking holes 46a after the release film 50 is fixed on the parting face, no wrinkles are formed. If the slackened parts are broad and many wrinkles are formed, fixing the release film on the parting face by air suction is stopped, then tension is applied to the release film 50 to extend the wrinkles and the release film 50 is fixed again by air suction. The small wrinkles left are drawn into the drawing grooves 46. Note that, the air sucking holes 46a may be formed in the escaping sections 52.

Second Embodiment

Figure 8:
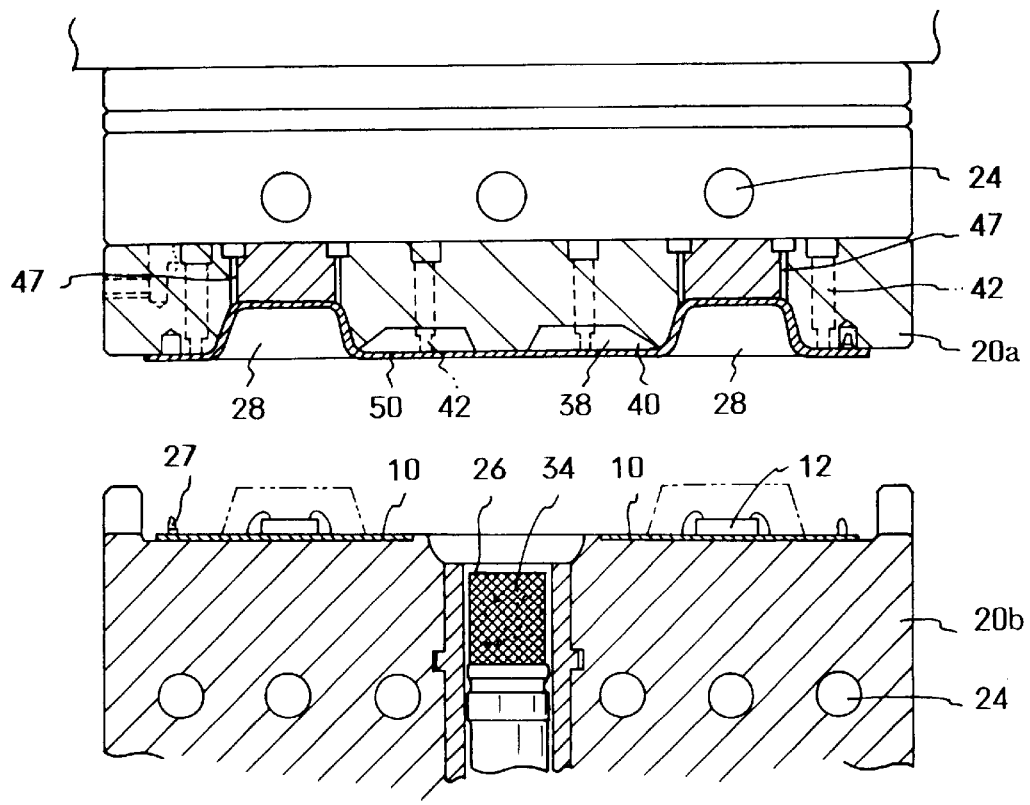
FIG. 8 is a sectional view of molding dies of a Second Embodiment.

The resin molding machine of a Second Embodiment is shown in FIG. 8. In the present embodiment, the cavities 28 are formed in the upper die 20a, and the lower die 20b has the setting sections in which the work pieces 10 will be set. The release film 50 covers over almost the whole parting face of the upper die 20a as in the First Embodiment. The release film 50 covers inner faces of the cavities 28 of the upper die 20a, so cavity air sucking holes 47, which look like slot holes, are opened along edges of a bottom face of each cavity 28.

Since the release film 50 has sufficient softness and flexibility, the release film can be fixed along the inner faces of the cavities 28, as shown in FIG. 8, by sucking air through the air sucking holes 47 after the release film 50 is flatly fixed on the parting face by sucking the air through the air sucking holes 42. Therefore the parting face and the inner faces of the cavities 28 can be covered with the release film 50.

In the present embodiment, the inner faces of the cavities 28 are covered with the release film 50, so the molded products can be easily ejected from the upper die 20a, and no ejector pins are required.

In the resin molding machine, the release film 50 is pressed onto the upper faces of the work pieces 10, which are molded or encapsulated with the resin, when the work pieces 10 are clamped with the release film 50. Therefore no resin leaks from the cavities and the resin paths on the work pieces 10, so the work pieces 10 can be molded without forming resin flash. In the case of molding or encapsulating the BGA circuit boards as the work pieces 10, there are formed electric cables on the upper face of the circuit boards, so the upper face thereof is not a flat face. However, the compressible release film 50 can absorb the unevenness of the electric cables, so no resin flash is formed on the surface.

In the present embodiment, the whole lower face of the work pieces 10 contact the lower die 20b, so the heat of the lower die 20b can be effectively conducted to the work pieces 10 and the resin in the cavities can be effectively solidified. If the work pieces 10 are BGA circuit boards, whose heat conductivity is low, and the cavities are formed in the lower die 20b, a contact area of the work pieces 10, which is capable of contacting the lower die 20b, is made narrow. Therefore, the work pieces 10 cannot be effectively heated and the resin cannot be effectively solidified. In the case of molding one side of the work pieces, shrink of the solidifying resin causes deformation of molded parts when the solidification of the resin is delayed. However, in the present embodiment, the whole lower face of the work pieces 10 contact the lower die 20b, so they can be effectively heated by the lower die 20b and quality of the molded products can be improved.

In the case of molding deformable work pieces, e.g., tape substrates, TAB tapes, step sections or concave sections, whose depth is equal to or higher than the thickness of the work pieces, are formed in the parting face. However, forming resin flash in the vicinity of the cavities and the resin paths can be prevented by the release film.

Third Embodiment

A Third Embodiment will be explained with reference to FIGS. 9 and 10. In the present embodiment, the molded product has electric terminals (leads), which are extended from two or four sides of a molded (encapsulated) part.

The cavities 28 are formed in the lower die 20b, and the release film 50 is fixed on the parting face of the upper die 20a by air suction as in the First Embodiment. In the present embodiment, the work pieces 10 are lead frames, bottom faces of the semiconductor chips 12 are exposed from the molded parts, and upper faces of the leads 11 are exposed from the molded parts.

The leads 11 of the lead frames 10 are bent at mid parts, thereof so that the molded product (semiconductor device) can be located above a surface of a circuit board when the molded product is set on the circuit board. In FIG. 10, the lead frame 10 and the release film 50 are clamped by the dies 20a and 20b, and the resin 35 is filled in the cavity 28a. The semiconductor chip 12 is fixed on a bottom face of the Lead frame 10, so the semiconductor chip 12 is in the cavity 28a. The release film 50 is pressed on the upper (exposed) faces of the leads 11.

Escaping pockets 54 are formed in the upper die 20a. The escaping pockets 54 are located to correspond to the exposed faces of the leads 11. The release film 50 covers over the upper faces of the leads 11 when the work pieces 10 are clamped. By covering the release film 50, no resin is stuck on the upper faces of the leads 11. The exposed parts of the leads 11 which are not supported by the lower die 20b or the parts of the leads 11 which are in the cavities are bent when they are pressed by the release film 50. However, in the present embodiment, the upper die 20a has escaping pockets 54, so the release film 50 does not bend the leads 11. The escaping pockets 54 act as well as the escaping sections 52 of the upper die 20a of the First Embodiment.

Inner parts of the leads 11, which are inside of the exposed parts, are not bent by the release film 50, so no escaping pockets 54 are required for those parts. The escaping pocket 54 is formed along the edges of the cavity 28a and located on the inner side of the edges. The escaping pockets 54 press the release film 50 onto the exposed parts of the leads 11 so as to prevent forming of resin flash thereon, so the depth of the escaping pockets 54 is designed so as not to excessively press and bend the leads 11. When the lead frames 10 are clamped, the release film 50 covering over the leads 11 is pressed into clearances "P" between the adjacent leads 11.

A part of the release film 50, which is located on an outer side of the cavity 28a is clamped, with prescribed force, by the dies 20a and 20b. Therefore, the clamped part of the release film 50 is fully compressed.

Figure 9:
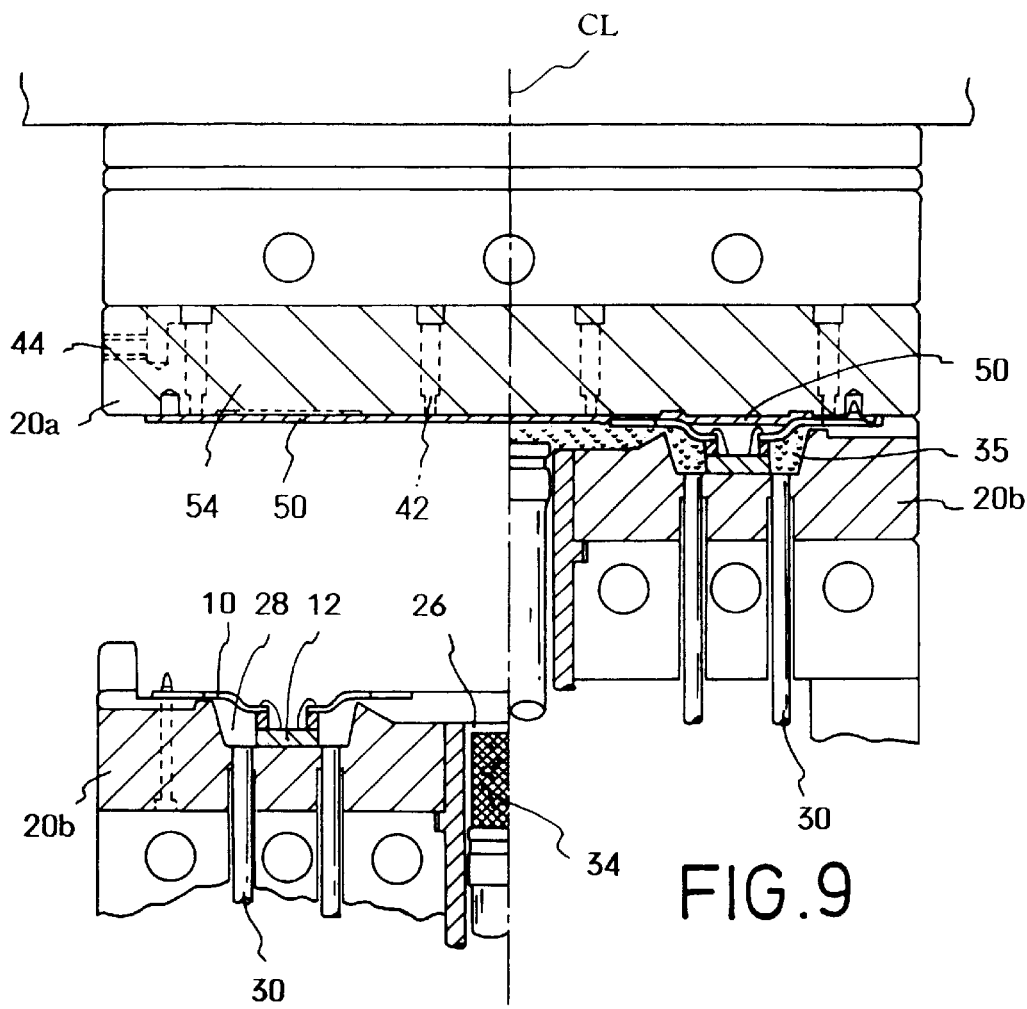
FIG. 9 is a sectional view of molding dies of a Third Embodiment.
Figure 10:
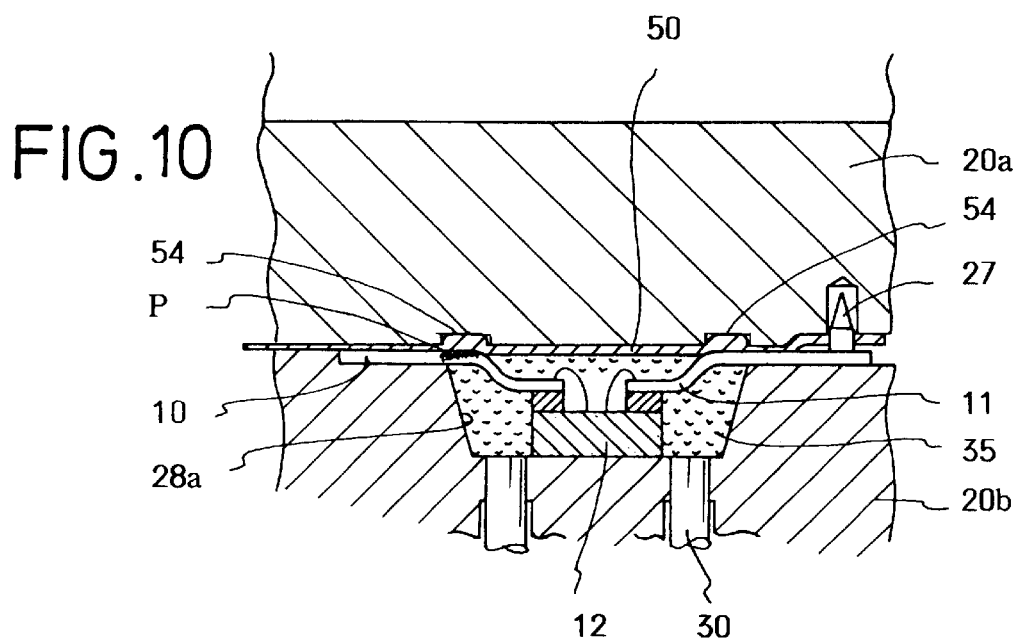
FIG. 10 is a partial sectional view of the molding dies of the Third Embodiment.

In FIG. 9, a state of setting the work piece 10 and the resin tablet 34 in the lower die 20b and fixing the release film 50 to the upper die 20a is shown on the left side of the center line CL; a state of clamping the work piece 10 and filling the melted resin 35 in the cavity 28 is shown on the right side of the center line CL.

The molding action of the resin molding machine of the present embodiment is the same as that of the First Embodiment, so explanation will be omitted. In the case of molding SON-type semiconductor devices by the resin molding machine of the present embodiment, forming resin flash on surfaces of terminals can be effectively prevented because exposed parts of leads of the work pieces can be securely covered with the release film 50. Thus, reliable SON-type semiconductor devices can be produced. In this case, the metal leads are exposed. In the case of tape or plastic substrates having circuits, etc., they can be similarly molded by the resin molding machine of the present embodiment.

Fourth Embodiment

Figure 11:
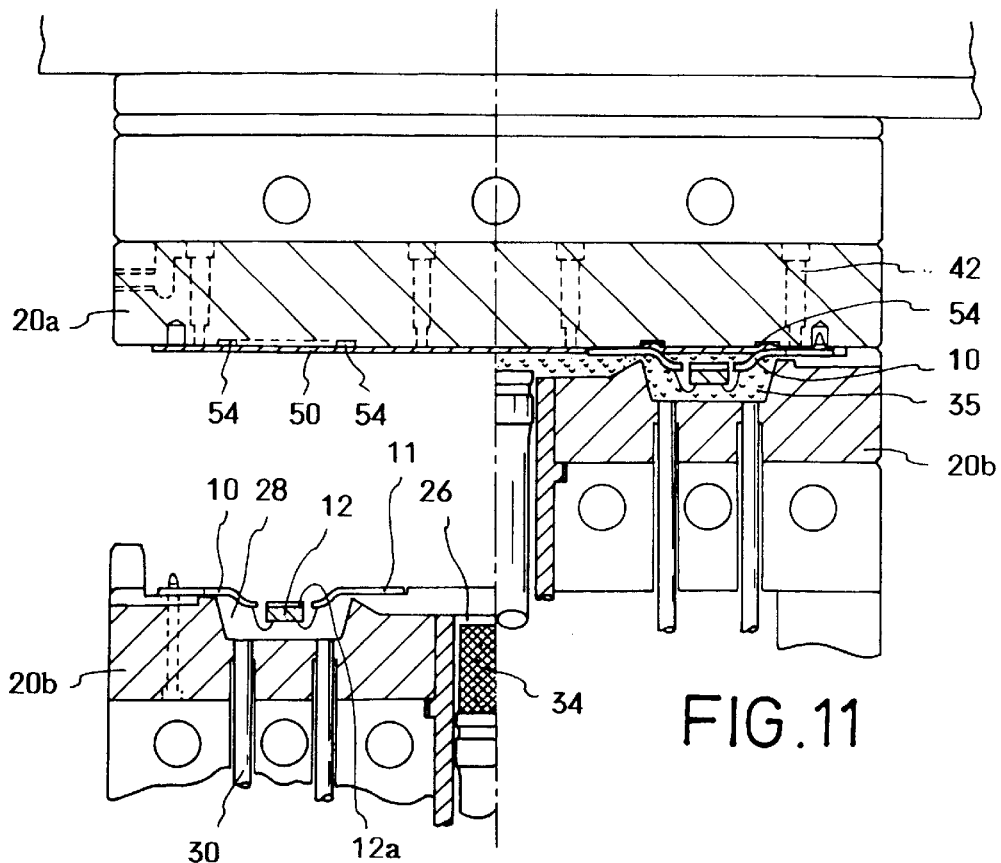
FIG. 11 is a sectional view of molding dies of a Fourth Embodiment.

A Fourth Embodiment will be explained with reference to FIG. 11. In the present embodiment, the semiconductor chips 12 are fully encapsulated with the resin 35. In the work piece 10, the leads 11 are bent at mid positions, so that a die pad 12a, on which the semiconductor chip 12 has been mounted, is located at a position slightly lower than the leads 11; the semiconductor chip 12 can be fully encapsulated in the resin 35.

The cavities 28 are formed in the lower die 20b, the release film 50 is fixed on the parting face of the upper die 20a, the escaping pockets 54 of the upper die 20a absorb the thickness of the release film 50 corresponding to base parts of the leads 11 as in the Third Embodiment. In the present embodiment too, by the release flim 50, the work pieces can be encapsulated without forming resin flash on surfaces of the external terminals (outer leads).

As described in the foregoing embodiments, the release film 50 is sandwiched between the work pieces 10 and the molding die, so the clamping force of the molding dies is applied to the work pieces 10 via the release film 50. The clamping force must not damage the work pieces 10.

Figure 12:
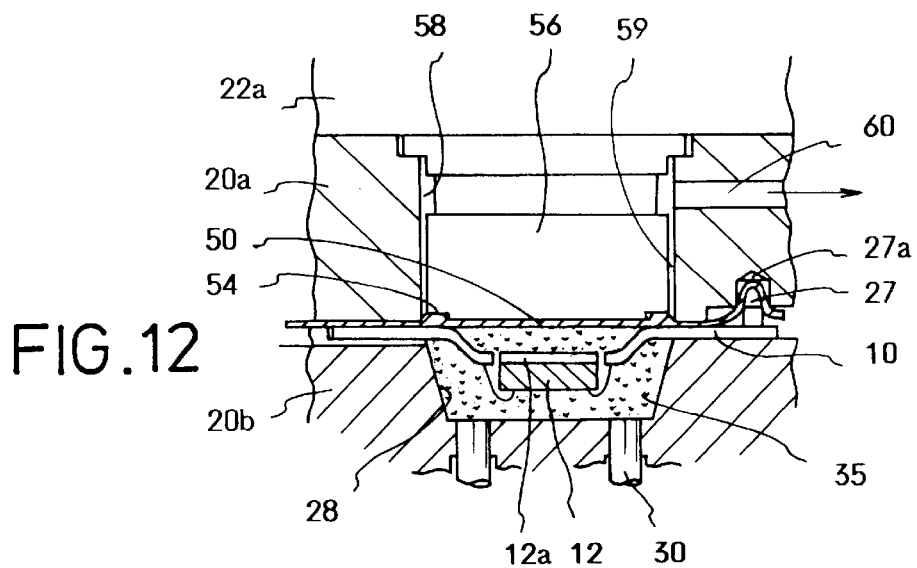
FIG. 12 is a sectional view of the molding dies in which a semiconductor chip is fully encapsulated in resin.

In an example shown in FIGS. 12 and 13, the clamping force applied to the work pieces 10 is reduced by the release film 50. FIGS. 12 and 13 show in the vicinity of the cavity in which the resin is filled.

In FIG. 12, a supporting block 56, which is capable of supporting an upper face of the release film 50, is provided in the upper die 20a. The supporting block 56 faces the cavity 28 of the lower die 20b. A plurality of the supporting blocks 56 are respectively provided in block holes 58 of the upper die 20a. There is formed an air sucking hole 59, through which air is sucked to fix the release film 50, between outer side faces of the supporting block 56 and inner faces of the block hole 58. An air path 60 is connected to the air sucking hole 59. The air path 60 is connected to an external air sucking mechanism, so that the air can be sucked through the air sticking holes 59.

The escaping pockets 54, which have been explained are formed in the Third Embodiment, in a lower end face of the supporting block 56. The escaping pockets 54 absorb the thickness of the release film 50 so as not to excessively press the leads of the work piece 10. Furthermore, in the present embodiment, the slackened parts of the release film 50 can be drawn into the escaping pockets 54 by sucking air through the air sucking hole 59 and the air path 60 when the release film 50 is sucked onto the upper die 20a, so that wrinkles of the release film 50 can be removed. Without the wrinkles, the release film 50 never excessively presses the work piece 10.

In FIG. 13, the release film 50 prevents the resin 35 from invading onto the upper face of the die pad 12a to expose the upper face thereof. There is provided a supporting section 56a, which is capable of supporting the upper face of the die pad 12a, at a lower end of the supporting block 56. The size of the supporting section 56 is designed according to the size of bends in the leads.

The air sucking hole 59 is formed between the supporting block 56 and the block hole 58, the release film 50 covers over the parting face and the supporting block 56 of the upper die 20a, and the escaping pockets 54 are formed at the lower end of the supporting block 56 as in the example shown in FIG. 12.

In this example, the slackened parts of the release film 50, which are expanded by the heat of the molding dies, are drawn by sucking air through the air path 60, and the die pad 12a of the work piece 10 is supported by the supporting section 56a, so that the die pad 12a can be fixed at a predetermined position and the work piece 10 can be molded while exposing the upper face of the die pad 12a and the upper faces of the outer leads.

Figure 14:
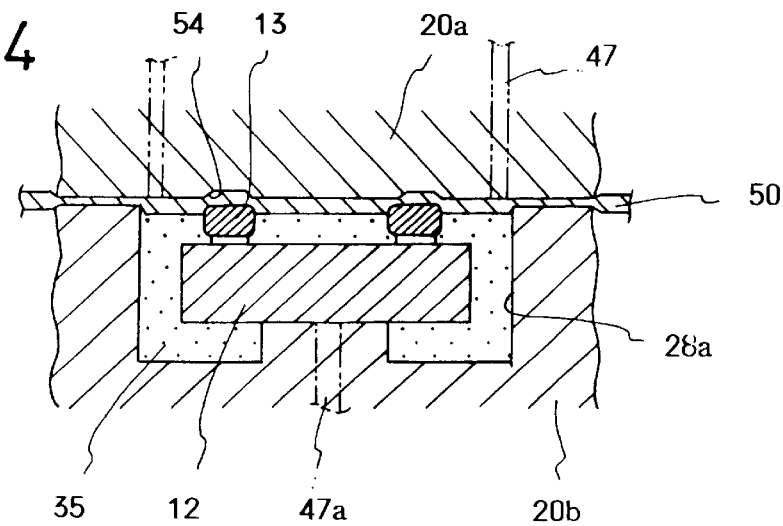
FIG. 14 is a sectional view of the molding dies for encapsulating a device whose outer terminals are bumps.

Another example is shown in FIG. 14. External terminals are bumps 13. To expose upper faces of the bumps 13 for electric connection, the release film 50 is fixed on the parting face of the upper die 20a by sucking air through the air sucking holes 47, and the release film 50 is pressed onto the upper faces of the bumps 13. The semiconductor chip 12 is molded or encapsulated by filling the resin 35 in the cavity 28a. An air sucking hole 47a is formed to fix the semiconductor chip 12 on an inner bottom face of the cavity 28a by air suction.

In this example too, the release film 50 is pressed onto the upper faces of the bumps 13 while molding, so no resin flash is formed on the exposed faces of the bumps 13.

This example can be applied to a method of molding circuit boards of IC cards, in which surfaces of terminals are exposed.

Fifth Embodiment

A Filth Embodiment will be explained with reference to FIG. 15. The work pieces 10 of the present embodiment are lead frames having heat sinks 80. The upper die 20a has cavities 82 for accommodating the heat sinks 80. The parting face of the upper die 20a, which includes inner faces of the cavities 82, is covered with a sheet of release film 50. A state of setting the work piece 10 on the lower die 20b is shown on the left side of the center line CL. The semiconductor chip 12 is mounted on the lower face of the workpiece 10; the heat sink 80 is fixed on the upper face thereof. The work piece 10 is set in the lower die 20b. The semiconductor chip 12 is set in the cavity 28 of the lower die 20b.

In FIG. 15, a state of clamping and molding the work piece 10 by the dies 20a and 20b is shown on the right side of the center line CL. The release film 50 is pressed onto the upper exposed face of the heat sink 80, so no resin flash is formed thereon. The resin 35 molds or encapsulates not only the semiconductor chip 12 but also side faces of the heat sink 80. An area of the escaping section 52 is slightly broader than that of the heat sink 80, so that no resin invades onto the upper face of the heat sink 80 and no resin flash is formed thereon.

Sixth Embodiment

Figure 16:
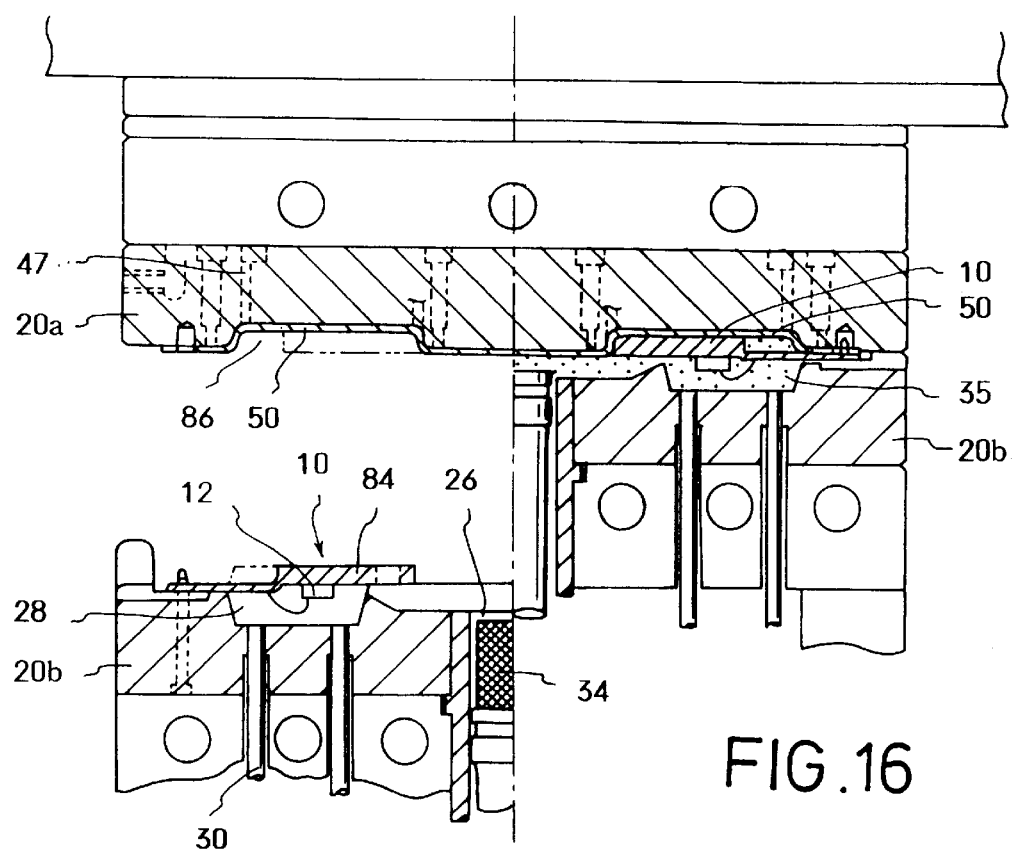
FIG. 16 is a sectional view of molding dies of a Sixth Embodiment.

A Sixth Embodiment will be explained with reference to FIG. 16. The work pieces 10 are lead frames for transistors having heat sinks 84. The semiconductor chips 12 are mounted on the heat sinks 84. A pluralilty of the heat sinks 84 are connected to the lead frame 10 at regular intervals. Dam sections of the die are fitted in spaces between the adjacent heat sinks 84 so as not to leak the resin therefrom. Cavities 86, in which the heat sinks 84 are accommodated, are formed in the upper die 20a. Furthermore, the parting face of the upper die 20a, which includes inner faces of the cavities 86, is covered with the release film 50.

A state of opening the dies 20a and 20b and setting the work piece 10 is shown on the left side of the center line CL. The semiconductor chip 12 is mounted on the lower face of the work piece 10. The semiconductor chip 12 is molded by filling the resin in the cavity 28 of the lower die 20b.

The release film 50 is pressed onto an upper face of the heat sink 84, so no resin invades onto the upper face thereof and no resin flash is formed thereon.

Figure 33:
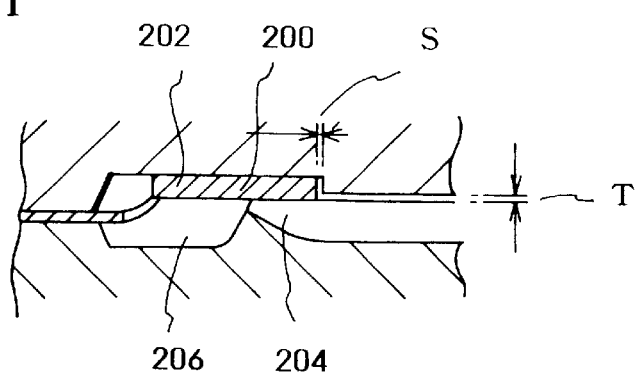
FIG. 33 is a sectional view of the conventional resin molding machine for encapsulating a semiconductor device having a heat sink.
Figure 34:
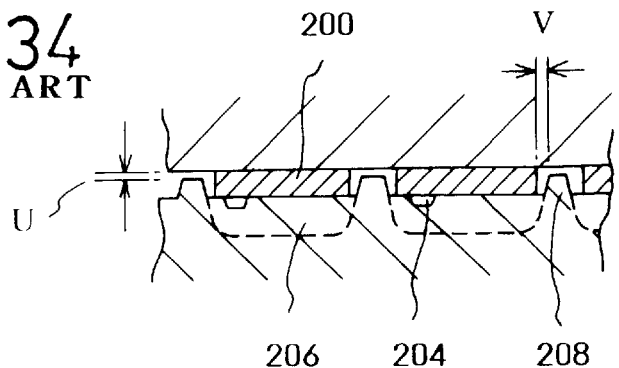
FIG. 34 is a sectional view of the conventional resin molding machine for encapsulating a semiconductor device having a heat sink.
Figure 35:
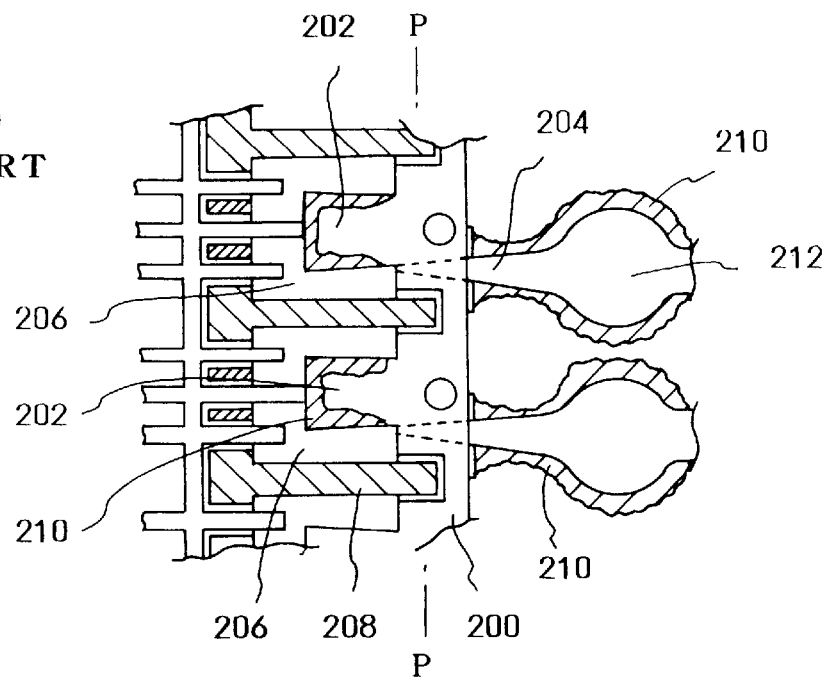
FIG. 35 is an explanation view showing the thin resin flash forming on the surfaces of the molded products, which is molded by the conventional resin molding machine.
Figure 36:
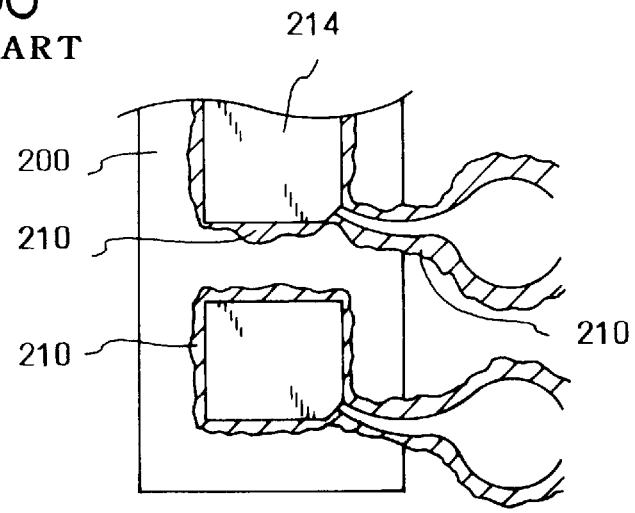
FIG. 36 is an explanation view showing the thin resin flash forming on the surfaces of the molded products, which is molded by the conventional resin molding machine.

By clamping the work piece 10 with the release film 50, no resin flash is formed. This theory will be explained with further reference to FIGS. 33 and 34. As to a front end of the heat sink 84, a gap "S" (see FIG. 33), which is formed between an end face of the heat sink 84 and a side face of a step part of the upper die 20a, is closed by the release film 50, so that no resin flash is formed at the front end of the heat sink 84. A gap "T" (see FIG. 33) between the parting faces of the dies 20a and 20b and a gap "U" (see FIG. 34) between the dam section and the parting face of the upper die 20a are closed by the release film 50, so that no resin flash is formed in the gaps. The release film 50, which is compressed by the dam section, closes gaps "V" (see FIG. 34) between each dam section and the work piece 10, so that no resin flash is formed on side faces of the work piece 10.

Seventh Embodiment

A Seventh Embodiment will be explained with reference to FIG. 17. The cavities 28 are formed in the upper die 20a; the work pieces 10 are set in the lower die 20b. Upper faces of the semiconductor chips 12 of the work pieces 10 are exposed.

The release film 50 is fed on the lower die 20b, and the work pieces 10 are set on the release film 50. The release film 50 covers lower faces of outer leads of the work pieces 10 so as not to form the resin flash thereon.

The structures of the molding dies 20a and 20b of the present embodiment are the inverted structures of the molding dies shown in FIG. 9. The work pieces 10 are arranged on both sides of the pots 26 of the lower die 20b, so two sheets of the release film 50 are fed. At least a side edge of the work piece 10, which is on the gate 40 side, should coincide with an inner side edge of the release film 50, so that the release film 50 is not lifted and no resin invades the lower side of the work piece.

Upper ends of the guide pins 27, which are capable of correctly positioning the work pieces 10, are sharpened, so that they can break the release film 50 when the work pieces 10 are clamped.

In the present embodiment, the release film 50 is pressed onto electric terminals of the work pieces 10 as in the embodiment shown in FIG. 9, so that no resin flash is formed on the surfaces of the electric terminals and the molded products (semiconductor devices) can be securely connected on circuit boards.

Figure 18:
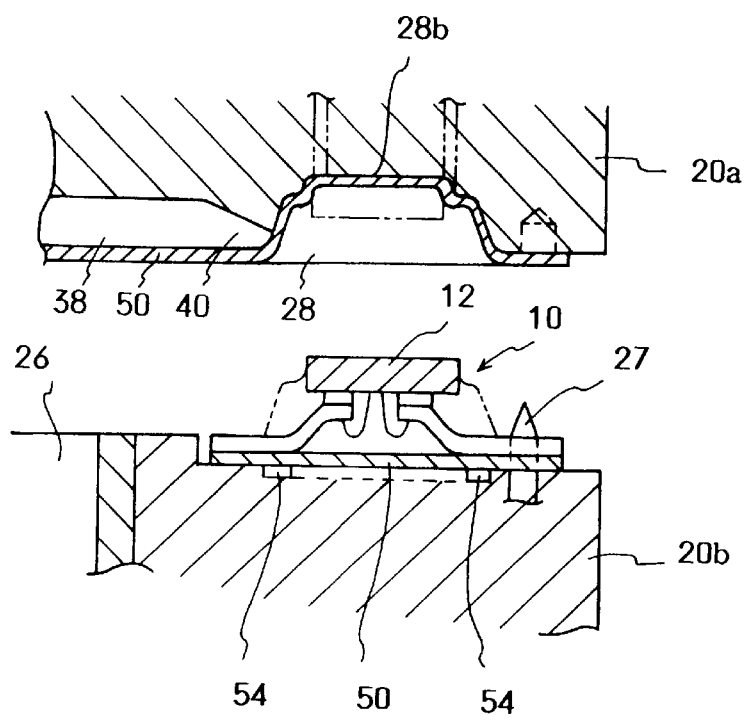
FIG. 18 is a sectional view of the molding dies in which release film are fed to both of the dies.

A modified example is shown in FIG. 18, two sheets of the release film 50 are respectively fed to the parting faces of the dies 20a and 20b. The parting faces including the inner faces of the cavities 28 are covered with the release film 50. By covering the parting face of the upper die 20a, an upper exposed face of the semiconductor chips 12 are covered with the release film 50, so that no resin invades onto the exposed faces and no resin flash is formed thereon.

A second cavity 28a, whose area is slightly broader than that of the semiconductor chip 12, is formed in a ceiling face of each cavity 28. By forming the second cavity 28a, the invasion of the resin, toward the exposed face of the semiconductor chip 12, can be prevented. In this example, parts of side faces of the semiconductor chip 12 are exposed. Furthermore stress applied to the the semiconductor chip 12, which is caused by the molding heat, can be effectively reduced.

Eighth Embodiment

An Eighth Embodiment will be explained with reference to FIG. 19. The semiconductor chips 12 are connected to a substrate of the work piece 10 by flip-chip connection. The upper die 20a has cavities 28 for molding the semiconductor chips 12, and the release film 50 covers over the parting face of the upper die 20a including the cavities 28. Note that, no release film 50 is fed onto the parting face of the lower die 20b.

The work pieces 10 are clamped by the dies 20a and 20b and the resin is introduced from the pots 26 to the cavities 28, so that the resin in filled in spaces between the semiconductor chips 12 and the substrate 10a. By exerting the melted resin, the resin can be securely filled in spaces between the adjacent bumps 13.

By covering the upper faces of the semiconductor chips 12 with the release film 50, no resin flash is formed on the exposed upper faces of the semiconductor chips 12. Furthermore, by forming the second cavities 28a, parts of side faces of each semiconductor chip 12 can be exposed.

Figure 17:
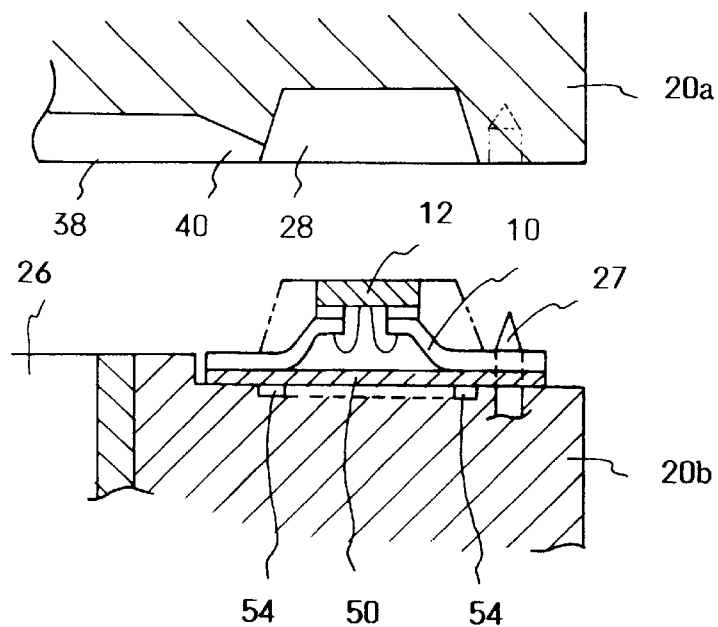
FIG. 17 is a sectional view of molding dies of a Seventh Embodiment.
Figure 19:
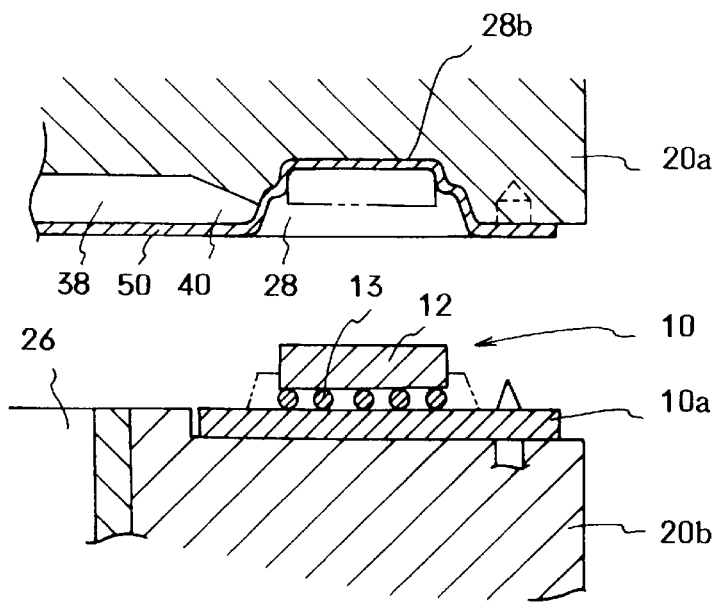
FIG. 19 is a sectional view of molding dies of an Eighth Embodiment.

Note that, in the resin molding machine shown in FIGS. 17–19, the gates 40 of the resin paths are formed in the upper die 20a.

Ninth Embodiment

A Ninth Embodiment will be explained with reference to FIGS. 20–22. In the resin molding machine of the present embodiment, concave sections 90 are respectively formed in package sections (resin molded sections) of the products. Inner patterns 100a are exposed in each concave section 90, and CCD parts, etc. will be connected to the inner patterns 100a. The inner patterns 100a are inner leads and die pads of lead frames, circuit patterns on plastic circuit boards, etc. In the present example, the inner patterns 100a are exposed inner leads.

Figure 21:
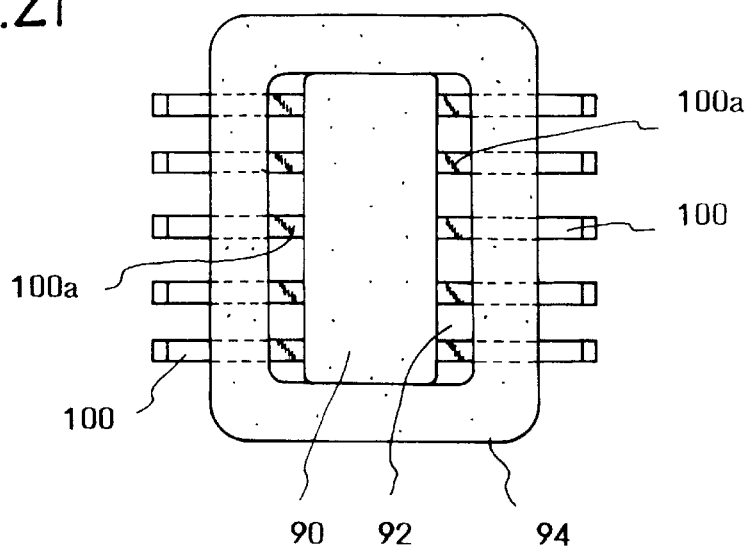
FIG. 21 is a plan view of parts of a CCD.

A plan view of the molded package section is shown in FIG. 21. There is formed the concave section 90 in which a semiconductor chip, etc. is set, the inner leads 100a of the leads 100 are exposed on step sections 92 of the concave section 90. The concave section 90 is enclosed by a resin wall section 94.

Figure 20:
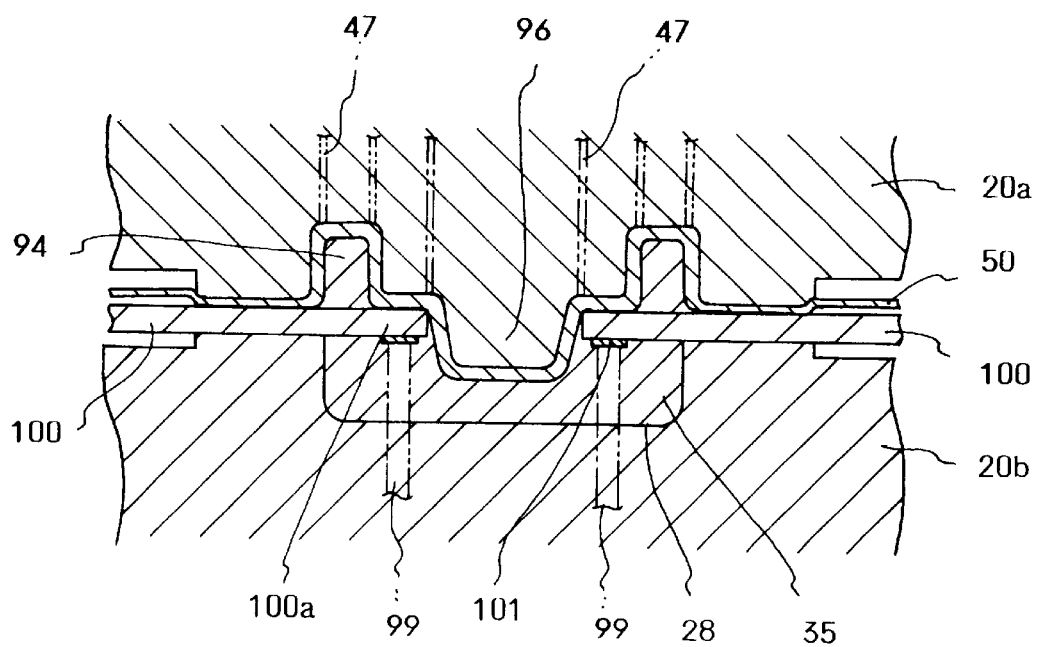
FIG. 20 is a sectional view of molding dies of a Ninth Embodiment.

As shown in FIG. 20, the release film 50 is fixed on the parting face of the upper die 20a, which includes projected section 96 for forming the concave section 90, by air suction. When the leads 100 are clamped by the dies 20a and 20b, the release film 50 is pressed onto the exposed inner leads 100a, so that no resin flash is formed on the exposed inner leads 100a. Since the exposed inner leads 100a act as electric terminals to which the semiconductor chips are connected, the resin molding machine of the present embodiment can produce reliable products.

Note that, lower faces of the inner leads 100a are fixed on upper end faces of supporting members 99 by adhesive tape 101 so as not to shift the leads 100. The supporting members 99 support the lower faces of the leads 100, so that the upper faces of the inner leads 100a can be securely pressed onto the release film 50 when the work pieces are clamped.

In FIG. 22, molded sections 35 are formed on one side of the work pieces 10. Since the work pieces 10 are supported by the lower die 20b, exposed parts of the work pieces 10 can be securely pressed and protected by the release film 50 by clamping the work pieces 10.

Tenth Embodiment

A Tenth Embodiment will be explained with reference to FIG. 23. The resin molding machine of the present embodiment molds or encapsulates multi-layered IC packages. The multi-layered IC package is made by piling a plurality of packages with mutual electrical connection, so surfaces of the leads must be exposed in both side faces of each package after molding.

Figure 23:
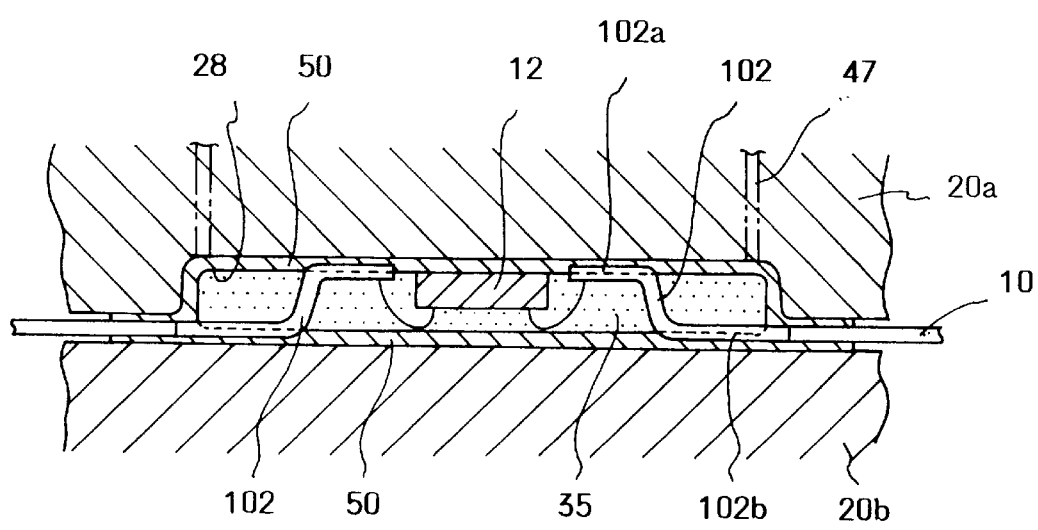
FIG. 23 is a sectional view of molding dies of a Tenth Embodiment.

FIG. 23 shows a state of clamping the work piece 10 by the dies 20a and 20b. Leads 102 of the work piece 10 are formed into an L-shape, and end sections of the leads 102 will be projected from a resin molded section (package section).

The upper die 20a has the cavities 28 for encapsulating the semiconductor chips 12 with the resin. The parting face of the upper die 20a, which includes the cavities 28, and the parting face of the lower die 20b are respectively covered with the release film 50, and the work pieces 10 are clamped between the release film 50. By clamping the work pieces 10 with the release film 50, exposed parts of the leads 102, which will be projected from the resin molded sections of the products, are covered with the release film 50, so that no resin flash is formed on the exposed parts.

A plurality of packages, which have been molded or encapsulated with the resin, are vertically piled to mutually electrically connect their leads 102. In the resin molding machine of the present embodiment, no resin flash is formed on the surfaces of the leads 102, so that the packages can be securely electrically connected to each other and reliability of the IC packages can be improved.

Eleventh Embodiment

An Eleventh Embodiment will be explained with reference to FIGS. 24 and 25. The resin molding machine of the present embodiment makes optical packages 108, in which rod-shaped lenses 104 (see FIG. 25) are held by a molded section 106. In the optical package 108, a plurality of the lenses 104 are held in the molded section 106, which is formed into a circular disc shape.

In FIG. 24, the rod-shaped lenses 104 are vertically arranged and clamped by the dies 20a and 20b, and they are molded by filling the resin 35 in the cavities of the dies.

The dies 20a and 20b respectively have cavities 21a and 21b, in which upper ends and lower ends of the lenses 104 are held. Two sheets of the release film 50 are respectively fed on the parting faces of the dies 20a and 20b to mold the molded section 106. In the cavities 21a and 21b, the release film 50 covers over outer faces of the lenses 104, so no resin 35 invades onto the outer faces of the lenses 104 when the resin 35 is filled. Since the lenses 104 are optical parts, resin flash must not be formed on the outer faces. Therefore, reliable products can be produced by the resin molding machine of the present embodiment.

By having enough flexibility and extensibility, the release film 50 can be easily deformed along external shapes of the lenses 104, and exposed parts of the lenses 104 can be securely covered with the release film 50. To form the cavities 21a and 21b, in which the release film 50 covers the ends of the lenses 104, holding members 110 may be provided in the cavities 21a and 21b as shown in FIG. 24. By clamping the lenses 104, by the dies 20a and 20b, with the release film 50, the release film 50 is extended and fits and covers over the ends of the lenses 104.

Twelfth Embodiment

A Twelfth Embodiment will be explained with reference to FIGS. 26 and 27. The resin molding machine of the present embodiment molds a holding section 116 of an optical cable 112, which includes a plurality of optical fibers, with resin. The holding section 116 bundles the optical fibers as one optical cable 112. In FIG. 26, the optical cable 112 is held, by the dies 20a and 20b, with the release film 50, and the resin 35 is filled in the cavity 28. A pusher 114 presses the release film 50 onto an upper end face of the optical cable 112 to prevent the resin from sticking thereon. By pushing the release film 50, which has sufficient elasticity, onto the upper end face of the optical cable 112, no resin 35 invades onto the upper end face thereof while molding.

By molding the holding section 116 of the optical cable 112 with the resin 35, the optical cable 112 can be attached to a predetermined place with high positioning accuracy. By molding with the release film 50, the end face of the optical cable (end faces of the optical fibers) can be clean without sticking resin flash, dusts, etc. The optical cable 112 having the molded holding section 116 is shown in FIG. 27.

Thirteenth Embodiment

A Thirteenth Embodiment will be explained with reference to FIGS. 28 and 29. The resin molding machine of the present embodiment molds pin grid parts. Each of the pin grid parts has a plastic base board 123, which will be molded, and a plurality of pins 120, which will be vertically extended from the base board 121. Heads sections 120a of the pins 120 will be projected from a bottom face of the base board 121.

In FIG. 28, the pins 120 are set in the lower die 20b. The pins 120 are pierced through a tape-shaped pin holder 122 so as to vertically set the pins 120 in the lower die 20b. The pins 120 are set in the lower die 20b together with the pin holder 122. The tape-shaped pin holder 122 may be made from the film materials of the release film 50. In the case of film-formed pin holder 122, it may be fed by the film feeding mechanism for feeding the release film 50.

Through-holes 124, which are arranged to correspond to the pins 120, are bored in the lower die 20b; supporting pins 126, which respectively support the pins 120, are provided in each through-hole 124. The supporting pins 126 are always biased upward by springs 128.

The upper die 20a has the cavities 28, and the release film 50 is fed on the parting face of the upper die 20a including the cavities 28. The depth of the cavities 28 define the height of the base boards 121 of the pin grid parts. The ceiling faces of the cavities 28 push the head sections 120a of the pins 120. In the present embodiment, the head sections 120a of the pins 120 are pressed onto the release film 50 while molding. The springs 128 always bias the pins 120 upward, and the ceiling faces of the cavities 28 securely press the release film 50 onto the head sections 120a of the pins 120 when the dies 20a and 20b are closed.

In the present embodiment, upper end faces of the head sections 120a of the pins 120 are securely covered with the release film 50 while molding, so no resin flash is formed on the exposed (upper) faces of the head sections 120a. Furthermore, the head sections 120a can be securely electrically connected by wire bonding, etc. Further, by piercing the pins 120 through the pin holder 122, no resin flash is formed on exposed parts of the pins 120.

Figure 29:
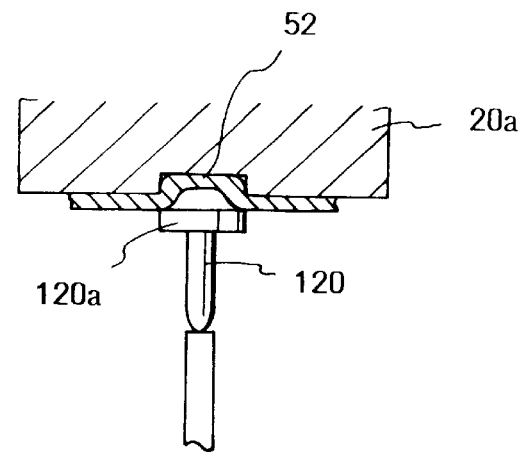
FIG. 29 is a partial sectional view of a pin section of FIG. 28.

In FIG. 29, the escaping sections 52, which correspond to the pins 120, are formed in the upper die 20a, so that resin invasion can be further prevented by the release film 50. In the present embodiment, the upper end faces of the head sections 120a coincide with the upper face of the base board 121, but they may be projected from or retracted in the upper face of the base board 121.

Fourteenth Embodiment

Figure 30:
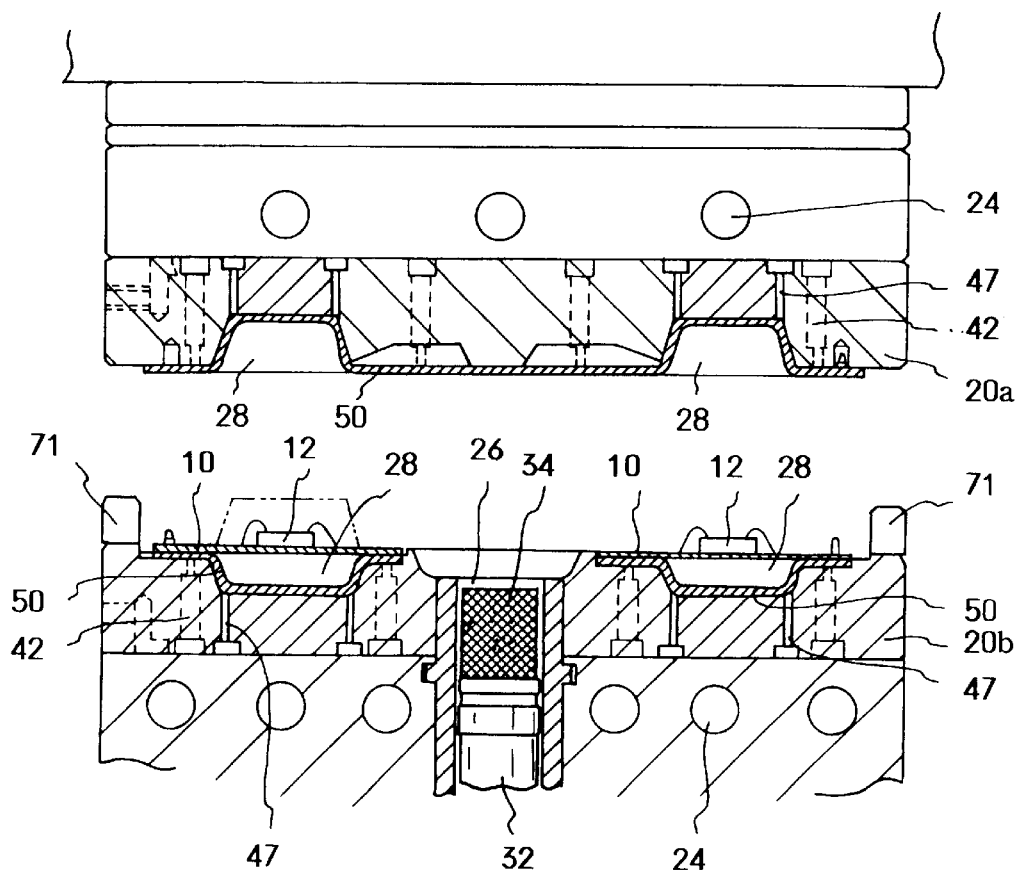
FIG. 30 is a sectional view of molding dies of a Fourteenth Embodiment.
Figure 31:
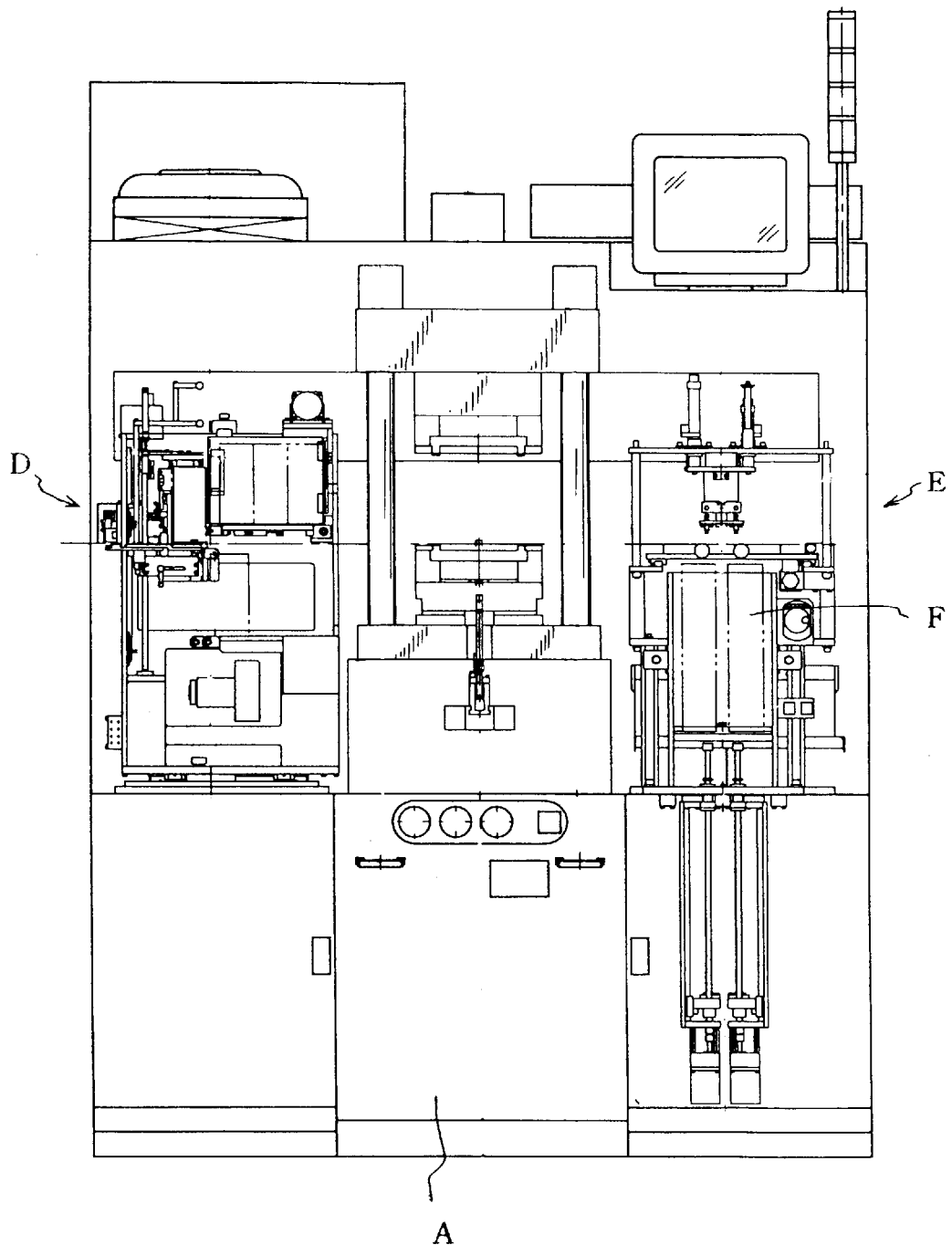
FIG. 31 is a front view of the conventional resin molding machine.
Figure 32:
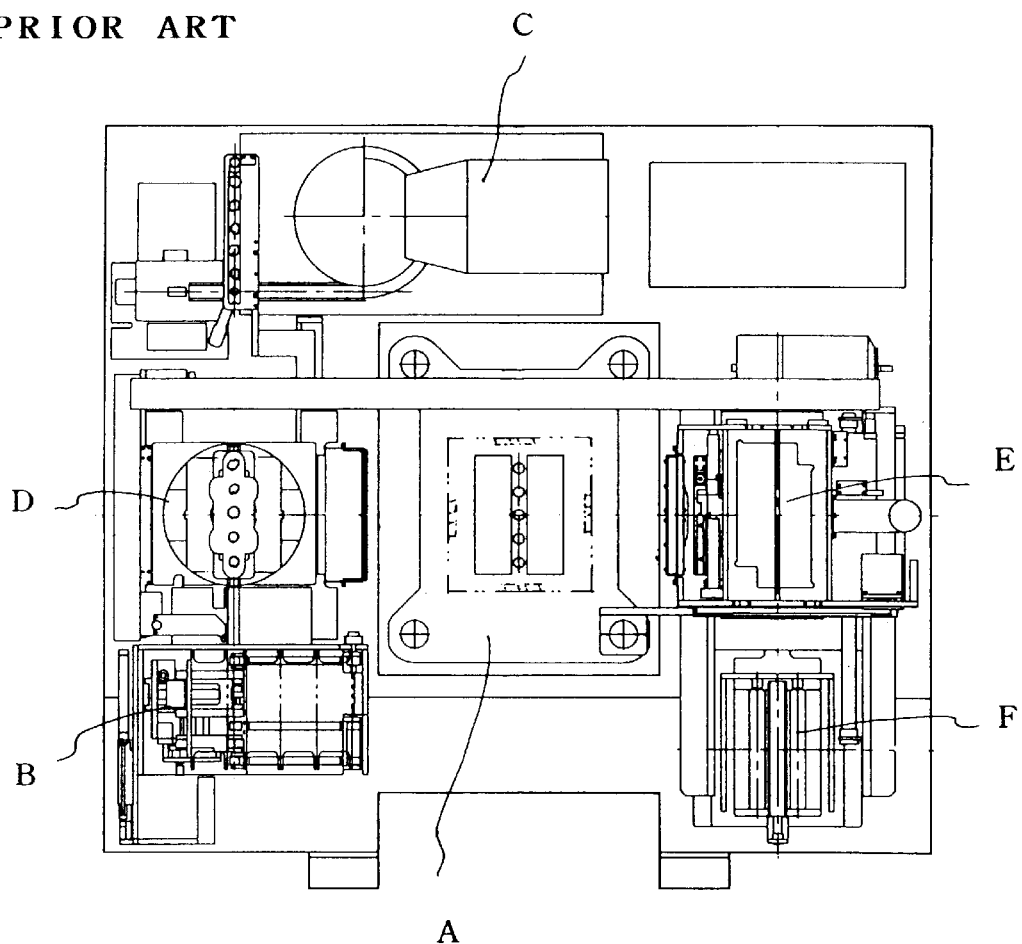
FIG. 32 is a plan view of the conventional resin molding machine.

A Fourteenth Embodiment will be explained with reference to FIG. 30. In the present embodiment, the wide release film 50 is fed to the upper die 20a; and two sheet of the narrow release film 50 are fed to the lower die 20b and arranged on each side of the pot 26.

Work pieces 10 are clamped with the release film 50 and molded or encapsulated with the resin 34, so no resin invades the parts of the work pieces 10, which are covered with the release film 50.

Some types of lead frames, e.g., palladium plated lead frames, need no surface treatment, so it is advantageous for them to prevent the resin from invading onto their leads.

The resin molding machine of the present embodiment is capable of molding or encapsulating lead frames having no dam bars with resin. Since the release film 50 has high flexibility and compressibility, the release film 50 having proper thickness is capable of entering and closing spaces between the adjacent leads, so the release film 50 act as the dam bars while molding.

Note that, in the above described embodiments, the pots 26 are provided in the lower dies 20b, but the present invention can be applied to the resin molding machine whose pots 26 are provided in the upper die 20a. In the both types of the resin molding machines, the method of the present invention can be executed by feeding the release film 50 to at least one of the molding dies 20a and 20b.

The invention may be embodied in other specific forms without departing from the spirit or essential characteristics thereof. The present embodiments are therefore to be considered in all respects as illustrative and restrictive, the scope of the invention being indicated by the appended claims rather than by the foregoing description and all changes which come within the meaning and range of equivalency of the claims are therefore intended to be embraced therein.

What is claimed is:

1. A resin molding machine, comprising:

a press section including a pair of molding dies for clamping and molding a work piece to be molded, and a pair of platens to which said molding dies are respectively attached;

a loading section for setting said work piece and a resin material into said molding die of said press section;

an unloading section for conveying a molded product from said press section;

an accommodating section for accommodating said molded product from which disused resin has been removed;

a film feeding mechanism provided on one of the platens, said film feeding mechanism for feeding release film to cover over said parting face, including a molding section and a drawing groove formed in a peripheral portion of the molding section and into which a slackened part of said release film is drawn, of said at least one of said molding dies; and an air sucking mechanism for fixing said release film on said parting face of said at least one of said molding dies by air suction.

2. The resin molding machine according to claim 1, wherein said loading section is located on one side of said press section, said unloading section being located on the other side thereof, wherein said film feeding mechanism feeds said release film in a direction perpendicular to a line connecting said loading section and said unloading section.

3. The resin molding machine according to claim 1, wherein said film feeding mechanism comprises:

a feeding roller on which a length of new release film has been wound, said feeding roller being provided on one side of said molding dies;

a collecting roller for winding used release film, which has passed over said parting face of said at least one of said molding dies, said collecting roller being provided on the other side of said molding dies; and a driving section for rotating said feeding roller and said collecting roller according to molding action of said resin molding machine.

4. The resin molding machine according to claim 1, wherein a width of said release film is designed to cover over an entire parting face of said at least one of said molding dies.

5. The resin molding machine according to claim 1, wherein a width of said release film is equal to that of said work piece, and said release film is fed to a position corresponding to said work piece.

6. The resin molding machine according to claim 1, further comprising lock blocks respectively provided on said molding dies and capable of engaging with each other to correctly position said molding dies when said molding dies clamp said work piece, said lock blocks being arranged to not interfere with said release film covering said at least one of said molding dies.

7. The resin molding machine according to claim 1, wherein an escaping section, in which said release film can be accommodated, is formed in the parting face of said at least one of said molding dies.

8. The resin molding machine according to claim 7, wherein said drawing groove is formed in a peripheral portion of the escaping section of said at least one of said molding dies.

9. The resin molding machine according to claim 1, wherein said parting face of at least one of said molding dies includes an escaping section; and said release film is accommodated in said escaping section to prevent deformation of said work piece when one of said molding dies presses said release film on a surface of said work piece.

* * * * *